US010236048B1

(12) United States Patent
Tzoufras et al.

(10) Patent No.: US 10,236,048 B1
(45) Date of Patent: Mar. 19, 2019

(54) AC CURRENT WRITE-ASSIST IN ORTHOGONAL STT-MRAM

(71) Applicant: Spin Memory, Inc., Fremont, CA (US)

(72) Inventors: Michail Tzoufras, Sunnyvale, CA (US); Marcin Jan Gajek, Berkeley, CA (US); Kadriye Deniz Bozdag, Sunnyvale, CA (US); Mourad El Baraji, Fremont, CA (US)

(73) Assignee: Spin Memory, Inc., Fremont, CA (US)

( * ) Notice: Subject to any disclaimer, the term of this patent is extended or adjusted under 35 U.S.C. 154(b) by 0 days.

(21) Appl. No.: 15/859,030

(22) Filed: Dec. 29, 2017

(51) Int. Cl.
| G11C 11/00 | (2006.01) |
| G11C 11/16 | (2006.01) |
| H01L 43/02 | (2006.01) |
| H01L 43/08 | (2006.01) |
| H01F 10/32 | (2006.01) |
| H01L 27/22 | (2006.01) |
| H01L 43/10 | (2006.01) |

(52) U.S. Cl.
CPC ........ G11C 11/1675 (2013.01); G11C 11/161 (2013.01); H01F 10/329 (2013.01); H01F 10/3272 (2013.01); H01F 10/3286 (2013.01); H01L 27/222 (2013.01); H01L 43/02 (2013.01); H01L 43/08 (2013.01); H01L 43/10 (2013.01)

(58) Field of Classification Search
CPC ............... G11C 11/1675; G11C 11/161; H01F 10/3272; H01F 10/3286; H01F 10/329; H01L 27/222; H01L 43/02; H01L 43/08; H01L 43/10

USPC ........................................................ 365/158
See application file for complete search history.

(56) References Cited

U.S. PATENT DOCUMENTS

| 341,801 A | 5/1886 | Fox |
| 5,541,868 A | 7/1996 | Prinz |
| 5,629,549 A | 5/1997 | Johnson |
| 5,640,343 A | 6/1997 | Gallagher et al. |
| 5,654,566 A | 8/1997 | Johnson |
| 5,691,936 A | 11/1997 | Sakakima et al. |
| 5,695,846 A | 12/1997 | Lange et al. |
| 5,695,864 A | 12/1997 | Slonczewski |
| 5,732,016 A | 3/1998 | Chen et al. |

(Continued)

FOREIGN PATENT DOCUMENTS

| CA | 2766141 A1 | 1/2011 |
| CN | 101036195 A | 9/2008 |

(Continued)

OTHER PUBLICATIONS

Final Office Action dated Jul. 9, 2015 in U.S. Appl. No. 14/242,419; 19 pages.

(Continued)

*Primary Examiner* — Huan Hoang
(74) *Attorney, Agent, or Firm* — Arnold & Porter Kaye Scholer

(57) ABSTRACT

Methods and structures useful for magnetoresistive random-access memory (MRAM) are disclosed. The MRAM device has a magnetic tunnel junction stack having a significantly improved performance of the free layer in the magnetic tunnel junction structure. The MRAM device utilizes an in-plane polarization magnetic layer and a perpendicular MTJ in conjugation with a programming current pulse that comprises an alternating perturbation frequency.

31 Claims, 13 Drawing Sheets

(56) References Cited

U.S. PATENT DOCUMENTS

| | | |
|---|---|---|
| 5,856,897 A | 1/1999 | Mauri |
| 5,896,252 A | 4/1999 | Kanai |
| 5,966,323 A | 10/1999 | Chen et al. |
| 6,016,269 A | 1/2000 | Peterson et al. |
| 6,055,179 A | 4/2000 | Koganei et al. |
| 6,097,579 A | 8/2000 | Gill |
| 6,124,711 A | 9/2000 | Tanaka et al. |
| 6,134,138 A | 10/2000 | Lu et al. |
| 6,140,838 A | 10/2000 | Johnson |
| 6,154,349 A | 11/2000 | Kanai et al. |
| 6,172,902 B1 | 1/2001 | Wegrowe et al. |
| 6,233,172 B1 | 5/2001 | Chen et al. |
| 6,243,288 B1 | 6/2001 | Ishikawa et al. |
| 6,252,798 B1 | 6/2001 | Satoh et al. |
| 6,256,223 B1 | 7/2001 | Sun |
| 6,292,389 B1 | 9/2001 | Chen et al. |
| 6,347,049 B1 | 2/2002 | Childress et al. |
| 6,376,260 B1 | 4/2002 | Chen et al. |
| 6,385,082 B1 | 5/2002 | Abraham et al. |
| 6,436,526 B1 | 8/2002 | Odagawa et al. |
| 6,458,603 B1 | 10/2002 | Kersch et al. |
| 6,493,197 B2 | 12/2002 | Ito et al. |
| 6,522,137 B1 | 2/2003 | Sun et al. |
| 6,532,164 B2 | 3/2003 | Redon et al. |
| 6,538,918 B2 | 3/2003 | Swanson et al. |
| 6,545,906 B1 | 4/2003 | Savtchenko et al. |
| 6,563,681 B1 | 5/2003 | Sasaki et al. |
| 6,566,246 B1 | 5/2003 | deFelipe et al. |
| 6,603,677 B2 | 8/2003 | Redon et al. |
| 6,653,153 B2 | 11/2003 | Doan et al. |
| 6,654,278 B1 | 11/2003 | Engel et al. |
| 6,677,165 B1 | 1/2004 | Lu et al. |
| 6,710,984 B1 | 3/2004 | Yuasa et al. |
| 6,713,195 B2 | 3/2004 | Wang et al. |
| 6,714,444 B2 | 3/2004 | Huai et al. |
| 6,744,086 B2 | 6/2004 | Daughton et al. |
| 6,750,491 B2 | 6/2004 | Sharma et al. |
| 6,765,824 B2 | 7/2004 | Kishi et al. |
| 6,772,036 B2 | 8/2004 | You et al. |
| 6,773,515 B2 | 8/2004 | Li et al. |
| 6,777,730 B2 | 8/2004 | Daughton et al. |
| 6,785,159 B2 | 8/2004 | Tuttle |
| 6,812,437 B2 | 11/2004 | Levy et al. |
| 6,829,161 B2 | 12/2004 | Huai et al. |
| 6,835,423 B2 | 12/2004 | Chen et al. |
| 6,838,740 B2 | 1/2005 | Huai et al. |
| 6,842,317 B2 | 1/2005 | Sugita et al. |
| 6,847,547 B2 | 1/2005 | Albert et al. |
| 6,887,719 B2 | 5/2005 | Lu et al. |
| 6,888,742 B1 | 5/2005 | Nguyen et al. |
| 6,902,807 B1 | 6/2005 | Argoitia et al. |
| 6,906,369 B2 | 6/2005 | Ross et al. |
| 6,920,063 B2 | 7/2005 | Huai et al. |
| 6,933,155 B2 | 8/2005 | Albert et al. |
| 6,958,927 B1 | 10/2005 | Nguyen et al. |
| 6,967,863 B2 | 11/2005 | Huai |
| 6,980,469 B2 | 12/2005 | Kent et al. |
| 6,985,385 B2 | 1/2006 | Nguyen et al. |
| 6,992,359 B2 | 1/2006 | Nguyen et al. |
| 6,995,962 B2 | 2/2006 | Saito et al. |
| 7,002,839 B2 | 2/2006 | Kawabata et al. |
| 7,005,958 B2 | 2/2006 | Wan |
| 7,006,375 B2 | 2/2006 | Covington |
| 7,009,877 B1 | 3/2006 | Huai et al. |
| 7,041,598 B2 | 5/2006 | Sharma |
| 7,045,368 B2 | 5/2006 | Hong et al. |
| 7,149,106 B2 | 12/2006 | Mancoff et al. |
| 7,170,778 B2 | 1/2007 | Kent et al. |
| 7,190,611 B2 | 3/2007 | Nguyen et al. |
| 7,203,129 B2 | 4/2007 | Lin et al. |
| 7,227,773 B1 | 6/2007 | Nguyen et al. |
| 7,262,941 B2 | 8/2007 | Li et al. |
| 7,307,876 B2 | 12/2007 | Kent et al. |
| 7,324,387 B1 | 1/2008 | Bergemont et al. |
| 7,335,960 B2 | 2/2008 | Han et al. |
| 7,351,594 B2 | 4/2008 | Bae et al. |
| 7,352,021 B2 | 4/2008 | Bae et al. |
| 7,376,006 B2 | 5/2008 | Bednorz et al. |
| 7,378,699 B2 | 5/2008 | Chan et al. |
| 7,449,345 B2 | 11/2008 | Horng et al. |
| 7,476,919 B2 | 1/2009 | Hong et al. |
| 7,502,249 B1 | 3/2009 | Ding |
| 7,573,737 B2 | 8/2009 | Kent et al. |
| 7,598,555 B1 | 10/2009 | Papworth-Parkin |
| 7,619,431 B2 | 11/2009 | DeWilde et al. |
| 7,630,232 B2 | 12/2009 | Guo |
| 7,643,332 B2 | 1/2010 | Leuschner |
| 7,679,155 B2 | 3/2010 | Korenivski |
| 7,911,832 B2 | 3/2011 | Kent et al. |
| 7,936,595 B2 | 5/2011 | Han et al. |
| 7,986,544 B2 | 7/2011 | Kent et al. |
| 8,014,193 B2 | 9/2011 | Nakayama et al. |
| 8,279,663 B2 | 10/2012 | Nakayama et al. |
| 8,279,666 B2 | 10/2012 | Dieny et al. |
| 8,334,213 B2 | 12/2012 | Mao |
| 8,357,982 B2 | 1/2013 | Kajiyama |
| 8,363,465 B2 | 1/2013 | Kent et al. |
| 8,456,883 B1 | 6/2013 | Liu |
| 8,488,375 B2 | 7/2013 | Saida et al. |
| 8,492,881 B2 | 7/2013 | Kuroiwa et al. |
| 8,508,979 B2 | 8/2013 | Saida et al. |
| 8,535,952 B2 | 9/2013 | Ranjan et al. |
| 8,574,928 B2 | 11/2013 | Satoh et al. |
| 8,576,616 B2 | 11/2013 | Saida et al. |
| 8,582,355 B2 | 11/2013 | Saida et al. |
| 8,617,408 B2 | 12/2013 | Balamane |
| 8,716,817 B2 | 5/2014 | Saida et al. |
| 8,737,122 B2 | 5/2014 | Saida et al. |
| 8,737,137 B1 | 5/2014 | Choy et al. |
| 8,779,537 B2 | 7/2014 | Huai |
| 8,823,118 B2 | 9/2014 | Horng |
| 8,852,760 B2 | 10/2014 | Wang et al. |
| 8,860,156 B2 | 10/2014 | Beach |
| 8,878,317 B2 | 11/2014 | Daibou et al. |
| 9,019,754 B1 | 4/2015 | Bedeschi |
| 9,025,368 B2 | 5/2015 | Saida et al. |
| 9,082,888 B2 | 7/2015 | Kent et al. |
| 9,117,995 B2 | 8/2015 | Daibou et al. |
| 9,159,342 B2 | 10/2015 | Kudo et al. |
| 9,245,608 B2 | 1/2016 | Chen et al. |
| 9,263,667 B1 | 2/2016 | Pinarbasi |
| 9,299,918 B2 | 3/2016 | Daibou et al. |
| 9,337,412 B2 | 3/2016 | Pinarbasi et al. |
| 9,362,486 B2 | 6/2016 | Kim et al. |
| 9,378,817 B2 | 6/2016 | Lee et al. |
| 9,379,314 B2 | 6/2016 | Park |
| 9,406,876 B2 | 8/2016 | Pinarbasi |
| 9,472,282 B2 | 10/2016 | Lee et al. |
| 9,472,748 B2 | 10/2016 | Kuo et al. |
| 9,484,527 B2 | 11/2016 | Han et al. |
| 9,548,445 B2 | 1/2017 | Lee et al. |
| 9,589,616 B2 | 3/2017 | Meng et al. |
| 9,728,712 B2 | 8/2017 | Kardasz et al. |
| 9,741,926 B1 | 8/2017 | Pinarbasi et al. |
| 9,773,540 B2 | 9/2017 | Zang et al. |
| 9,773,974 B2 | 9/2017 | Pinarbasi et al. |
| 9,853,206 B2 | 12/2017 | Pinarbasi et al. |
| 10,026,892 B2 | 7/2018 | Pinarbasi et al. |
| 10,032,978 B1 | 7/2018 | Schabes et al. |
| 2002/0090533 A1 | 7/2002 | Zhang et al. |
| 2002/0105823 A1 | 8/2002 | Redon et al. |
| 2002/0132140 A1 | 9/2002 | Igarashi et al. |
| 2003/0117840 A1 | 6/2003 | Sharma et al. |
| 2003/0151944 A1 | 8/2003 | Saito |
| 2003/0197984 A1 | 10/2003 | Inomata et al. |
| 2003/0218903 A1 | 11/2003 | Luo |
| 2004/0012994 A1 | 1/2004 | Slaughter et al. |
| 2004/0061154 A1 | 4/2004 | Huai et al. |
| 2004/0094785 A1 | 5/2004 | Zhu et al. |
| 2004/0125649 A1 | 7/2004 | Durlam et al. |
| 2004/0130936 A1 | 7/2004 | Nguyen et al. |
| 2004/0257717 A1 | 12/2004 | Sharma et al. |
| 2005/0041342 A1 | 2/2005 | Huai et al. |
| 2005/0051820 A1 | 3/2005 | Stojakovic et al. |

(56) References Cited

U.S. PATENT DOCUMENTS

| | | |
|---|---|---|
| 2005/0063222 A1 | 3/2005 | Huai et al. |
| 2005/0104101 A1 | 5/2005 | Sun et al. |
| 2005/0128842 A1 | 6/2005 | Wei |
| 2005/0136600 A1 | 6/2005 | Huai |
| 2005/0158881 A1 | 7/2005 | Sharma |
| 2005/0174702 A1 | 8/2005 | Gill |
| 2005/0180202 A1 | 8/2005 | Huai et al. |
| 2005/0184839 A1 | 8/2005 | Nguyen et al. |
| 2005/0201023 A1 | 9/2005 | Huai et al. |
| 2005/0237787 A1 | 10/2005 | Huai et al. |
| 2005/0280058 A1 | 12/2005 | Pakala et al. |
| 2006/0018057 A1 | 1/2006 | Huai |
| 2006/0049472 A1 | 3/2006 | Diao et al. |
| 2006/0087880 A1 | 4/2006 | Mancoff et al. |
| 2006/0092696 A1 | 5/2006 | Bessho |
| 2006/0132990 A1 | 6/2006 | Morise et al. |
| 2006/0227465 A1 | 10/2006 | Inokuchi et al. |
| 2007/0019337 A1 | 1/2007 | Apalkov et al. |
| 2007/0047294 A1 | 3/2007 | Panchula |
| 2007/0096229 A1 | 5/2007 | Yoshikawa et al. |
| 2007/0242501 A1 | 10/2007 | Hung et al. |
| 2008/0031035 A1 | 2/2008 | Rodmacq et al. |
| 2008/0049488 A1 | 2/2008 | Rizzo |
| 2008/0112094 A1 | 5/2008 | Kent et al. |
| 2008/0151442 A1 | 6/2008 | Mauri et al. |
| 2008/0151614 A1 | 6/2008 | Guo |
| 2008/0259508 A2 | 10/2008 | Kent et al. |
| 2008/0297292 A1 | 12/2008 | Viala et al. |
| 2009/0046501 A1 | 2/2009 | Ranjan et al. |
| 2009/0072185 A1 | 3/2009 | Raksha et al. |
| 2009/0091037 A1 | 4/2009 | Assefa et al. |
| 2009/0098413 A1 | 4/2009 | Kanegae |
| 2009/0161421 A1 | 6/2009 | Cho et al. |
| 2009/0209050 A1 | 8/2009 | Wang et al. |
| 2009/0209102 A1 | 8/2009 | Zhong et al. |
| 2009/0231909 A1 | 9/2009 | Dieny et al. |
| 2010/0019333 A1 | 1/2010 | Zhao et al. |
| 2010/0124091 A1 | 5/2010 | Cowburn |
| 2010/0193891 A1 | 8/2010 | Wang et al. |
| 2010/0232206 A1 | 9/2010 | Li |
| 2010/0246254 A1 | 9/2010 | Prejbeanu et al. |
| 2010/0271870 A1 | 10/2010 | Zheng et al. |
| 2010/0290275 A1 | 11/2010 | Park et al. |
| 2010/0304204 A1 | 12/2010 | Routkevitch et al. |
| 2011/0001108 A1 | 1/2011 | Greene et al. |
| 2011/0032645 A1 | 2/2011 | Noel et al. |
| 2011/0058412 A1 | 3/2011 | Zheng et al. |
| 2011/0089511 A1 | 4/2011 | Keshtbod et al. |
| 2011/0121417 A1 | 5/2011 | Li |
| 2011/0133298 A1 | 6/2011 | Chen et al. |
| 2011/0141804 A1* | 6/2011 | Apalkov ............. G01R 33/098 365/171 |
| 2011/0149632 A1 | 6/2011 | Chen et al. |
| 2011/0216436 A1 | 9/2011 | Igarashi |
| 2012/0052258 A1 | 3/2012 | Op DeBeeck et al. |
| 2012/0069649 A1 | 3/2012 | Ranjan et al. |
| 2012/0120520 A1 | 5/2012 | Childress et al. |
| 2012/0155156 A1 | 6/2012 | Watts |
| 2012/0156390 A1 | 6/2012 | Araki |
| 2012/0181642 A1 | 7/2012 | Prejbeanu et al. |
| 2012/0188818 A1 | 7/2012 | Ranjan et al. |
| 2012/0228728 A1 | 9/2012 | Ueki et al. |
| 2012/0280336 A1 | 11/2012 | Jan |
| 2012/0280339 A1 | 11/2012 | Zhang et al. |
| 2012/0294078 A1 | 11/2012 | Kent et al. |
| 2012/0299133 A1 | 11/2012 | Son et al. |
| 2013/0001506 A1 | 1/2013 | Sato et al. |
| 2013/0001652 A1 | 1/2013 | Yoshikawa et al. |
| 2013/0021841 A1 | 1/2013 | Zhou et al. |
| 2013/0062714 A1 | 3/2013 | Zhu |
| 2013/0075845 A1 | 3/2013 | Chen et al. |
| 2013/0119495 A1 | 5/2013 | Vetro et al. |
| 2013/0157385 A1 | 6/2013 | Jung et al. |
| 2013/0244344 A1 | 9/2013 | Malmhall et al. |
| 2013/0267042 A1 | 10/2013 | Satoh et al. |
| 2013/0270523 A1 | 10/2013 | Wang et al. |
| 2013/0270661 A1 | 10/2013 | Yi et al. |
| 2013/0307097 A1 | 11/2013 | Yi et al. |
| 2013/0341801 A1 | 12/2013 | Satoh et al. |
| 2014/0009994 A1 | 1/2014 | Parkin et al. |
| 2014/0036573 A1 | 2/2014 | Ishihara et al. |
| 2014/0042571 A1 | 2/2014 | Gan et al. |
| 2014/0048896 A1 | 2/2014 | Huang et al. |
| 2014/0070341 A1 | 3/2014 | Beach et al. |
| 2014/0087483 A1 | 3/2014 | Ohsawa |
| 2014/0093701 A1 | 4/2014 | Sahoo et al. |
| 2014/0103472 A1 | 4/2014 | Kent et al. |
| 2014/0169085 A1 | 6/2014 | Wang et al. |
| 2014/0177316 A1 | 6/2014 | Otsuka et al. |
| 2014/0217531 A1 | 8/2014 | Jan |
| 2014/0252439 A1 | 9/2014 | Guo |
| 2014/0252519 A1 | 9/2014 | Kim |
| 2014/0264671 A1 | 9/2014 | Chepulskyy et al. |
| 2015/0008550 A1 | 1/2015 | Min et al. |
| 2015/0056368 A1 | 2/2015 | Wang et al. |
| 2015/0171316 A1 | 6/2015 | Park et al. |
| 2015/0279904 A1 | 10/2015 | Pinarbasi |
| 2015/0287910 A1 | 10/2015 | Lu |
| 2015/0357015 A1 | 12/2015 | Kent et al. |
| 2016/0027999 A1 | 1/2016 | Pinarbasi |
| 2016/0087193 A1 | 3/2016 | Pinarbasi et al. |
| 2016/0093798 A1 | 3/2016 | Kim et al. |
| 2016/0099405 A1 | 4/2016 | Zimmer et al. |
| 2016/0111634 A1 | 4/2016 | Lee et al. |
| 2016/0126452 A1 | 5/2016 | Kuo et al. |
| 2016/0126453 A1 | 5/2016 | Chen et al. |
| 2016/0163965 A1 | 6/2016 | Han et al. |
| 2016/0163973 A1 | 6/2016 | Pinarbasi |
| 2016/0181508 A1 | 6/2016 | Lee et al. |
| 2016/0218278 A1 | 7/2016 | Pinarbasi et al. |
| 2016/0276006 A1 | 9/2016 | Ralph et al. |
| 2016/0284762 A1 | 9/2016 | Wang et al. |
| 2016/0315118 A1 | 10/2016 | Kardasz et al. |
| 2016/0315259 A1 | 10/2016 | Kardasz et al. |
| 2016/0372656 A1 | 12/2016 | Pinarbasi et al. |
| 2017/0025472 A1 | 1/2017 | Kim et al. |
| 2017/0033156 A1 | 2/2017 | Gan et al. |
| 2017/0033283 A1 | 2/2017 | Pinarbasi et al. |
| 2017/0033742 A1 | 2/2017 | Akerman |
| 2017/0047107 A1 | 2/2017 | Berger et al. |
| 2017/0084826 A1 | 3/2017 | Zhou et al. |
| 2017/0222132 A1 | 8/2017 | Pinarbasi et al. |
| 2017/0324029 A1 | 11/2017 | Pinarbasi et al. |
| 2017/0331032 A1 | 11/2017 | Chen et al. |
| 2017/0331033 A1 | 11/2017 | Kardasz et al. |
| 2017/0346002 A1 | 11/2017 | Pinarbasi et al. |
| 2018/0047894 A1 | 2/2018 | Pinarbasi et al. |
| 2018/0076382 A1 | 3/2018 | Park et al. |
| 2018/0114898 A1 | 4/2018 | Lee |
| 2018/0248110 A1 | 8/2018 | Kardasz et al. |
| 2018/0248113 A1 | 8/2018 | Pinarbasi et al. |

FOREIGN PATENT DOCUMENTS

| | | |
|---|---|---|
| CN | 102334207 A | 1/2012 |
| CN | 102959693 A | 3/2013 |
| CN | 105706259 A | 6/2016 |
| CN | 105917480 A | 8/2016 |
| CN | 106062979 A | 10/2016 |
| CN | 107750382 A | 3/2018 |
| CN | 107851712 A | 3/2018 |
| EP | 1345277 A1 | 9/2003 |
| EP | 3298636 A1 | 3/2018 |
| FR | 2817998 A1 | 6/2002 |
| FR | 2832542 A1 | 5/2003 |
| FR | 2910716 A1 | 6/2008 |
| JP | H10-004012 A | 1/1998 |
| JP | H11-120758 A | 4/1999 |
| JP | H11-352867 A | 12/1999 |
| JP | 2001-195878 A | 7/2001 |
| JP | 2002-261352 A | 9/2002 |
| JP | 2002-357489 A | 12/2002 |
| JP | 2003-318461 A | 11/2003 |
| JP | 2005-044848 | 2/2005 |

(56) References Cited

FOREIGN PATENT DOCUMENTS

| | | |
|---|---|---|
| JP | 2005-150482 A | 6/2005 |
| JP | 2005-535111 A | 11/2005 |
| JP | 4066477 B2 | 3/2006 |
| JP | 2006-128579 A | 5/2006 |
| JP | 2008-524830 A | 7/2008 |
| JP | 2009-027177 A | 2/2009 |
| JP | 2013-021546 A | 1/2013 |
| JP | 2013-219010 A | 10/2013 |
| JP | 2014-039061 A | 2/2014 |
| JP | 5635666 B2 | 12/2014 |
| JP | 2015-002352 A | 1/2015 |
| JP | 2017-510989 A | 4/2017 |
| JP | 2017-527097 A | 9/2017 |
| JP | 2017-532752 A | 11/2017 |
| KR | 10-2014-0115246 A | 9/2014 |
| KR | 10-2015-0016162 A | 2/2015 |
| WO | WO 2009-080636 A1 | 7/2009 |
| WO | WO 2011-005484 A2 | 1/2011 |
| WO | WO 2014-062681 A1 | 4/2014 |
| WO | WO-2015-153142 A1 | 10/2015 |
| WO | 2016011435 A1 | 1/2016 |
| WO | WO-2016-014326 A1 | 1/2016 |
| WO | WO-2016-048603 A1 | 3/2016 |
| WO | WO-2016-171800 A1 | 10/2016 |
| WO | WO-2016-171920 A1 | 10/2016 |
| WO | WO-2016-204835 A1 | 12/2016 |
| WO | WO-2017-019134 A1 | 2/2017 |
| WO | WO-2017-030647 A1 | 2/2017 |
| WO | WO-2017-131894 A1 | 8/2017 |

OTHER PUBLICATIONS

Final Office Action dated Aug. 2, 2018 in U.S. Appl. No. 15/674,620.
NonFinal Office Action dated Mar. 20, 2015 in U.S. Appl. No. 14/242,419; 18 pages.
NonFinal Office Action dated Sep. 11, 2015 in U.S. Appl. No. 14/492,943; 13 pages.
NonFinal Office Action dated Jan. 20, 2016 in U.S. Appl. No. 14/242,419; 17 pages.
NonFinal Office Action dated Dec. 23, 2016 in U.S. Appl. No. 15/093,367; 13 pages.
NonFinal Office Action dated Jan. 25, 2017 in U.S. Appl. No. 15/097,576; 17 pages.
NonFinal Office Action dated Feb. 6, 2017 in U.S. Appl. No. 14/814,036; 22 pages.
NonFinal Office Action dated Jun. 29, 2018 in U.S. Appl. No. 15/859,381.
Nonfinal Office Action dated Jun. 26, 2018 in U.S. Appl. No. 15/859,384.
NonFinal Office Action dated Jun. 29, 2018 in U.S. Appl. No. 15/859,374.
Notice of Allowance dated Sep. 26, 2018 in U.S. Appl. No. 15/859,047; 10 pages.
Notice of Allowance dated Oct. 24, 2018 in U.S. Appl. No. 15/859,517.
Office Action dated Aug. 30, 2018 in Chinese Patent Application No. 201580009984.2.
Office Action dated Oct. 9, 2018 in Japanese Patent Application No. 2016- 526761.
R.H. Koch, et al., "Thermally Assisted Magnetization Reversal in Submicron-Sized Magnetic Thin Films"; Physical Review Letters; The American Physical Society; vol. 84, No. 23; Jun. 5, 2000, pp. 5419-5422 (4 pages).
K.J. Lee, et al., "Analytical investigation of spin-transfer dynamics using a perpendicular-to-plane polarizer"; Applied Physics Letters; American Institute of Physics; vol. 86, (2005); pp. 022505-1 to 022505-3 (3 pages).
Kirsten Martens, et al., "Thermally Induced Magnetic Switching in Thin Ferromagnetic Annuli"; NSF grants PHY-0351964 (DLS); 2005; 11 pages.

Kirsten Martens, et al., "Magnetic Reversal in Nanoscopic Ferromagnetic Rings"; NSF grants PHY-0351964 (DLS); 2006; 23 pages.
"Magnetic Technology Sprintronics, Media and Interface"; Data Storage Institute, R&D Highlights; Sep. 2010; 3 pages.
S. Ikeda, et al.; "A perpendicular-anisotropy CoFeB—MgO magnetic tunnel junction"; Nature Materials, vol. 9, Sep. 2010; pp. 721-724; 4 pages.
Soo-Man Seo, et al.; "Current-induced synchronized switching of magnetization;" Applied Physics Letters 101; 2012 American Institute of Physics; Aug. 7, 2012; 6 pages.
Kent, et al.; U.S. Appl. No. 61/715,111, filed Oct. 17, 2012, entitled "Inverted Orthogonal Spin Transfer Layer Stack".
Pinarbasi, et al.; U.S. Appl. No. 14/341,185, filed Jul. 25, 2014, entitled "Method for Manufacturing MTJ Memory Device".
Pinarbasi, et al.; U.S. Appl. No. 14/492,943, filed Sep. 22, 2014, entitled , "Magnetic Tunnel Junction Structure for MRAM Device".
International Search Report and Written Opinion dated Jul. 10, 2015 in PCT/US2015/021580; 12 pages.
Pinarbasi, et al.; U.S. Appl. No. 14/814,036, filed Jul. 30, 2015, entitled "Precessional Spin Current Structure for MRAM".
Kardasz, et al.; U.S. Appl. No. 14/866,359, filed Sep. 25, 2015, entitled "Spin Transfer Torque Structure for MRAM Devices Having a Spin Current Injection Capping Layer".
International Search Report and Written Opinion dated Oct. 30, 2015 in PCT/US2015/040700; 11 pages.
International Search Report and Written Opinion dated Dec. 14, 2015 in PCT/US2015/047875; 13 pages.
Pinarbasi, et al.; U.S. Appl. No. 15/041,325, filed Feb. 11, 2016, entitled "Method for Manufacturing MTJ Memory Device".
Kardasz, et al.; U.S. Appl. No. 15/091,853, filed Apr. 6, 2016, entitled "High Annealing Temperature Perpendicular Magnetic Anisotropy Structure for Magnetic Random Access Memory".
Pinarbasi, et al.; U.S. Appl. No. 15/093,367, filed Apr. 7, 2016, entitled "Magnetic Tunnel Junction Structure for MRAM Device".
Pinarbasi, et al.; U.S. Appl. No. 15/097,576, filed Apr. 13, 2016, entitled "Polishing Stop Layer(s) for Processing Arrays of Semiconductor Elements".
Pinarbasi, et al.; U.S. Appl. No. 15/157,783, filed May 18, 2016, entitled "Memory Cell Having Magnetic Tunnel Junction and Thermal Stability Enhancement Layer".
Berger, et al.; U.S. Appl. No. 15/174,482, filed Jun. 6, 2016, entitled "Method and Apparatus for Bipolar Memory Write-Verify".
International Search Report and Written Opinion dated Jun. 17, 2016 in PCT/US2016/021324; 9 pages.
International Search Report and Written Opinion dated Jun. 17, 2016 in PCT/US2016/021691; 9 pages.
International Search Report and Written Opinion dated Jul. 15, 2016 in PCT/US2016/026473; 9 pages.
International Search Report and Written Opinion dated Jul. 21, 2016 in PCT/US2016/027445; 10 pages.
International Search Report and Written Opinion dated Sep. 26, 2016 in PCT/US2016/037843; 10 pages.
Pinarbasi, et al.; U.S. Appl. No. 15/445,260, filed Feb. 28, 2017, entitled "Precessional Spin Current Structure for MRAM".
Pinarbasi, et al.; U.S. Appl. No. 15/445,362, filed Feb. 28, 2017, entitled "Precessional Spin Current Structure for MRAM".
International Search Report and Written Opinion dated Apr. 7, 2017 in PCT/US2016/067444; 13 pages.
Notice of Allowance dated Apr. 21, 2017 in U.S. Appl. No. 15/157,783; 36 pages.
Pinarbasi, et al.; U.S. Appl. No. 15/656,398, filed Jul. 21, 2017, entitled "Memory Cell Having Magnetic Tunnel Junction and Thermal Stability Enhancement Layer".
Kardasz, et al.; U.S. Appl. No. 15/657,498, filed Jul. 24, 2017, entitled "Spin Transfer Torque Structure for MRAM Devices Having a Spin Current Injection Capping Layer".
Notice of Allowance dated Jul. 27, 2017 in U.S. Appl. No. 15/097,576; 22 pages.
Pinarbasi, et al.; U.S. Appl. No. 15/674,620, filed Aug. 11, 2017, entitled "Polishing Stop Layer(s) for Processing Arrays of Semiconductor Elements".
Schabes, et al.; U.S. Appl. No. 15/634,629, filed Jun. 27, 2017, entitled "MRAM with Reduced Stray Magnetic Fields".

(56) References Cited

OTHER PUBLICATIONS

Notice of Allowance dated Oct. 16, 2017 in U.S. Appl. No. 14/814,036; 16 pages.
Pinarbasi, et al.; U.S. Appl. No. 15/794,871, filed Oct. 26, 2017, entitled "Precessional Spin Current Structure for MRAM".
Tzoufras, et al.; U.S. Appl. No. 15/858,950, filed Dec. 29, 2017, entitled "AC Current Pre-Charge Write-Assist in Orthogonal STT-MRAM".
Gajek, et al.; U.S. Appl. No. 15/858,988, filed Dec. 29, 2017, entitled "Self-Generating AC Current Assist in Orthogonal STT MRAM".
Ryan, et al.; U.S. Appl. No. 15/859,015, filed Dec. 29, 2017, entitled "Shared Oscillator (STNO) for MRAM Array Write-Assist in Orthogonal STT-MRAM".
Bozdag, et al.; U.S. Appl. No. 15/859,047, filed Dec. 29, 2017, entitled "Three-Terminal MRAM with AC Write-Assist for Low Read Disturb".
Schabes, et al.; U.S. Appl. No. 15/862,788, filed Jan. 5, 2018, entitled "Perpendicular Magnetic Tunnel Junction Device with Skyrmionic Enhancement Layers for the Precessional Spin Current Magnetic Layer".
Schabes, et al.; U.S. Appl. No. 15/859,384, filed Dec. 30, 2017, entitled "Perpendicular Magnetic Tunnel Junction Device with Skyrmionic Assist Layers for Free Layer Switching".
Schabes, et al.; U.S. Appl. No. 15/859,381, filed Dec. 30, 2017, entitled "Perpendicular Magnetic Tunnel Junction Device with Precessional Spin Current Layer Having a Modulated Moment Density".
Schabes, et al.; U.S. Appl. No. 15/859,379, filed Dec. 30, 2017, entitled "Perpendicular Magnetic Tunnel Junction Device with Offset Precessional Spin Current Layer".
Schabes, et al.; U.S. Appl. No. 15/859,374, filed Dec. 30, 2017, entitled "Switching and Stability Control for Perpendicular Magnetic Tunnel Junction Device".
El Baraji, et al.; U.S. Appl. No. 15/859,514, filed Dec. 30, 2017, entitled "Microwave Write-Assist in Orthogonal STT-MRAM".
El Baraji, et al.; U.S. Appl. No. 15/859,517, filed Dec. 30, 2017, entitled "Microwave Write-Assist in Series-Interconnected Orthogonal STT-MRAM Devices".
International Search Report and Written Opinion dated May 10, 2018 in PCT/US2018/014645; 14 pages.
International Search Report and Written Opinion dated May 30, 2018 in PCT/US2018/014641; 13 pages.

* cited by examiner

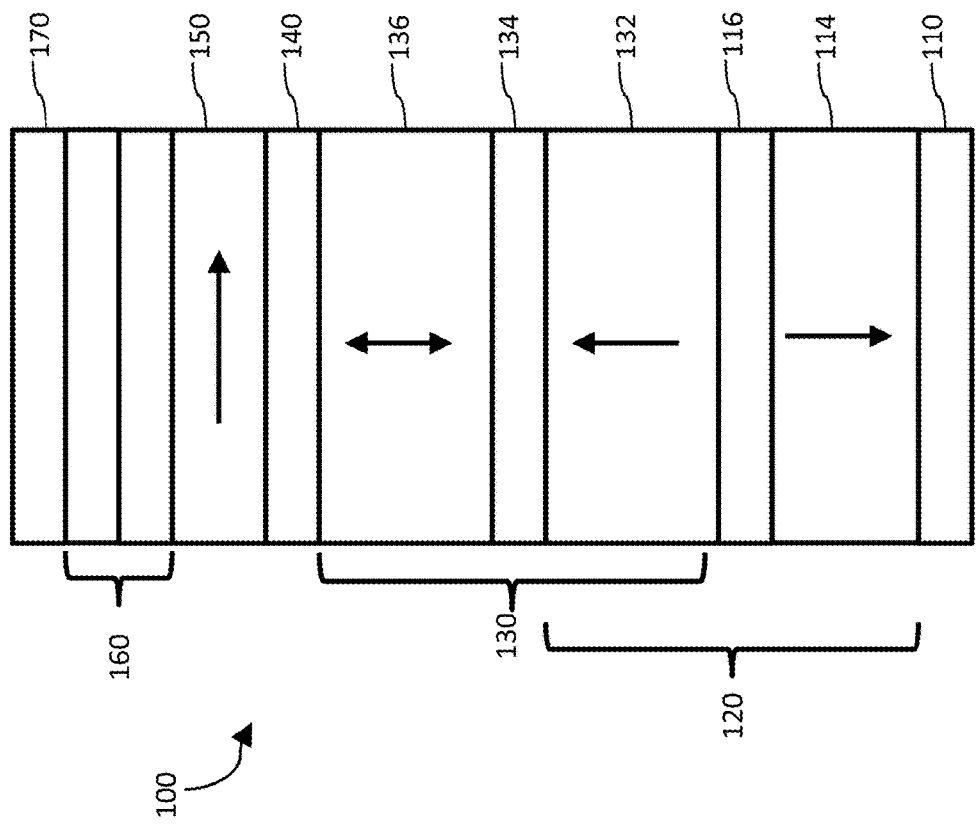

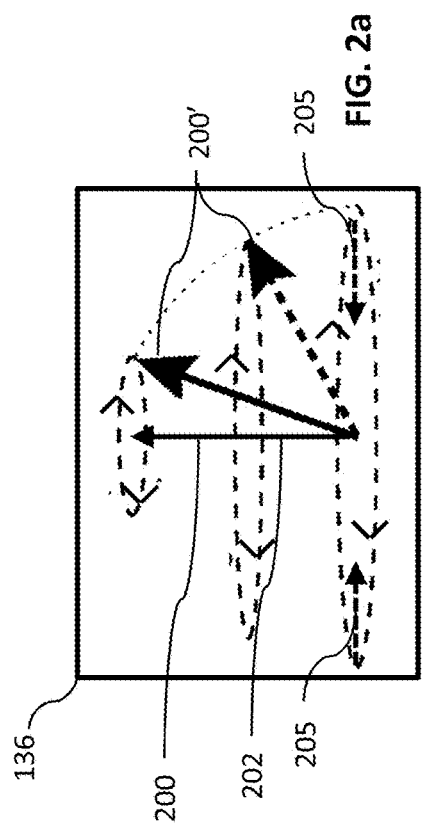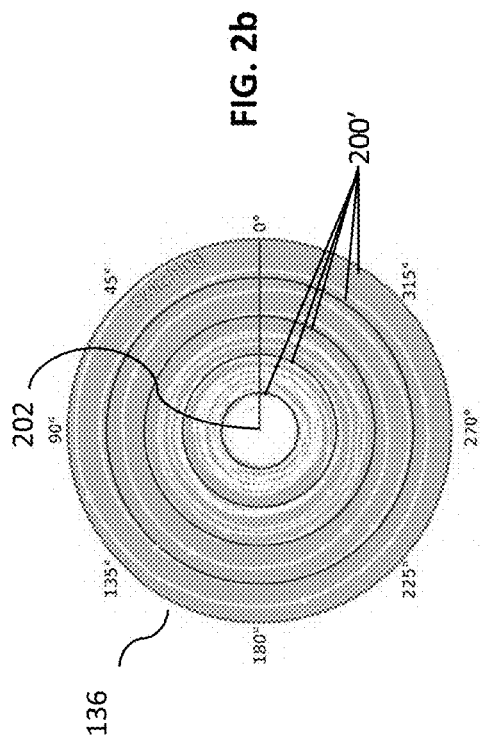

AC CURRENT WRITE-ASSIST IN ORTHOGONAL STT-MRAM

FIELD

The present patent document relates generally to spin-transfer torque magnetic random access memory and, more particularly, to a magnetic tunnel junction stack having improved performance of the free layer in the magnetic tunnel junction structure.

BACKGROUND

Magnetoresistive random-access memory ("MRAM") is a non-volatile memory technology that stores data through magnetic storage elements. These elements are two ferromagnetic plates or electrodes that can hold a magnetic field and are separated by a non-magnetic material, such as a non-magnetic metal or insulator. In general, one of the plates has its magnetization pinned (i.e., a "reference layer"), meaning that this layer has a higher coercivity than the other layer and requires a larger magnetic field or spin-polarized current to change the orientation of its magnetization. The second plate is typically referred to as the free layer and its magnetization direction can be changed by a smaller magnetic field or spin-polarized current relative to the reference layer.

MRAM devices store information by changing the orientation of the magnetization of the free layer. In particular, based on whether the free layer is in a parallel or anti-parallel alignment relative to the reference layer, either a "1" or a "0" can be stored in each MRAM cell. Due to the spin-polarized electron tunneling effect, the electrical resistance of the cell changes due to the orientation of the magnetic fields of the two layers. The cell's resistance will be different for the parallel and anti-parallel states and thus the cell's resistance can be used to distinguish between a "1" and a "0". One important feature of MRAM devices is that they are non-volatile memory devices, since they maintain the information even when the power is off. The two plates can be sub-micron in lateral size and the magnetization direction can still be stable with respect to thermal fluctuations.

Spin transfer torque or spin transfer switching, uses spin-aligned ("polarized") electrons to change the magnetization orientation of the free layer in the magnetic tunnel junction ("MTJ"). In general, electrons possess a spin, a quantized number of angular momentum intrinsic to the electron. An electrical current is generally unpolarized, i.e., it consists of 50% spin up and 50% spin down electrons. Passing a current though a magnetic layer polarizes electrons with the spin orientation corresponding to the magnetization direction of the magnetic layer thus produces a spin-polarized current. If a spin-polarized current is passed to the magnetic region of a free layer in the MTJ device, the electrons will transfer a portion of their spin-angular momentum to the magnetization layer to produce a torque on the magnetization of the free layer. Thus, this spin transfer torque can switch the magnetization of the free layer, which, in effect, writes either a "1" or a "0" based on whether the free layer is in the parallel or anti-parallel states relative to the reference layer.

When a current is passed through a magnetic layer (e.g., a polarizer), the spin orientation of the electrons that flow out of the magnetic layer is generally aligned in the direction of the magnetization of the magnetic layer and will exert a spin-transfer torque in that direction (forming a transverse spin current) upon impinging on another magnetic layer. However, due to the conservation of angular moment for the system, the electrons on the opposite side of the magnetic layer, those that do not go through the magnetic layer, generally have a spin orientation that is aligned in the direction that is anti-parallel to the magnetization direction of the magnetic layer. The net effect of this process is that the current applied to the magnetic layer undergoes spin filtering, which creates a spin current on one side of the magnetic layer, with spins that are aligned with magnetization direction of the magnetic layer, and a reflected spin current on the other side of the magnetic layer, with spins that are anti-parallel to the magnetization direction of the magnetic layer. This effect occurs upon application of a current to any magnetic layer, including an in-plane polarization layer or an out-of-plane reference magnetic layer. Thus, in a typical MTJ, when switching the magnetization direction of the free layer in one direction (e.g., from the parallel to anti-parallel state) is achieved using spin transfer torque from the transverse spin current, switching the free layer in the other direction (e.g., from the anti-parallel to parallel states) would be achieved using spin transfer torque from the reflected spin current. This is typically accomplished by running electrical current through the MTJ in one direction when switching from the anti-parallel to parallel state and running the electrical current through the MTJ in the other direction when switching from the parallel to anti-parallel state.

FIG. 1 illustrates a MTJ stack 100 for an MRAM device including MTJ stack 130 and an in-plane polarizer 150. As shown, stack 100 includes one or more seed layers 110 provided at the bottom of stack 100 to initiate a desired crystalline growth in the above-deposited layers. Furthermore, MTJ 130 is deposited on top of SAF layer 120. MTJ 130 includes reference layer 132, which is a magnetic layer, a non-magnetic tunneling barrier layer (i.e., the insulator) 134, and the free layer 136, which is also a magnetic layer. It should be understood that reference layer 132 is actually part of SAF layer 120, but forms one of the ferromagnetic plates of MTJ 130 when the non-magnetic tunneling barrier layer 134 and free layer 136 are formed on reference layer 132. As shown in FIG. 1, reference magnetic layer 132 has a magnetization direction perpendicular to its plane. As also seen in FIG. 1, free layer 136 also has a magnetization direction perpendicular to its plane, but its direction can vary by 180 degrees.

The first magnetic layer 114 in the SAF layer 120 is disposed over seed layer 110. SAF layer 120 also has a antiferromagnetic coupling layer 116 disposed over the first magnetic layer 114. Furthermore, a nonmagnetic spacer 140 is disposed on top of MTJ 130 and a polarizer 150 is disposed on top of the nonmagnetic spacer 140. Polarizer 150 is a magnetic layer that has a magnetic direction in its plane, but is perpendicular to the magnetic direction of the reference layer 132 and free layer 136. Polarizer 150 is provided to polarize a current of electrons ("spin-aligned electrons") applied to MTJ structure 100. Polarizer 150 polarizes the current in a direction perpendicular (orthogonal) to those of the magnetizations of the free magnetic layer 136 and reference magnetic layer 132. Further, one or more capping layers 160 can be provided on top of polarizer 150 to protect the layers below on MTJ stack 100. Finally, a hard mask 170 is deposited over capping layers 160 and is provided to pattern the underlying layers of the MTJ structure 100, using a combination of reactive ion etch (RIE) and ion beam etching (IBE) processes.

Various mechanisms have been proposed to assist the free-layer magnetization switching in MTJ devices. One issue has been that to realize the orthogonal spin transfer effect for in-plane MTJ structures, large spin currents may be required for switching. The need for large switching currents may limit the commercial applicability of such a device. One way proposed to reduce switching current is to lower the magnetization of the free layer. However, if the effective magnetization of the free layer is lowered significantly, the orthogonal effect has to be limited so that the free-layer does not go into precessional mode that would make the end state of the free-layer magnetization un-deterministic. This defines the operation window for the in-plane OST structures. In an in-plane device, unlike that shown in FIG. 1, the magnetization direction of the reference layer and free layer are in the plane of the layer. Another aspect of in-plane devices is that the thermal stability requirements may limit the size of the MTJ devices to approximately sixty nanometers or higher.

In contrast to MTJ structures with an in-plane free layer and perpendicular polarizer, perpendicular MTJ structures such as those shown in FIG. 1, are less prone to getting into a pure precessional regime. This is due to the fact that in perpendicular MTJ structures, the direction of the demagnetization field and perpendicular anisotropy contributions are the same. In this case the precession is generally not an issue and the end-state is more deterministic. However, precession may be an issue with regards to read disturb, particularly when stronger read currents are used. The orthogonal polarizer acts on the free layer magnetization at the initial state, but when the precession takes hold, the fixed orthogonal polarizer 150 helps only half the cycle of the free-layer magnetization rotation and it harms the other half of the cycle. This is demonstrated with reference to FIGS. 2-3. FIG. 2a-2b shows switching of a free layer 136 of an MTJ. As is seen, free layer 136 has a magnetization direction 200 perpendicular to that of the polarizer 150. The magnetization direction 200 of the free layer 136 can rotate by 180 degrees. FIGS. 2a-2b show precession about the axis of the magnetization vector of free layer 136. During precession, magnetic vector 200 begins to rotate about its axis in a cone-like manner such that its magnetization vector 200' deflects from the perpendicular axis 202 of free layer 136. Whereas prior to initiating precession, no component of magnetic vector 200 is in the plane of free layer 136, once precession starts, a component of magnetic vector 200' can be found both in-plane and orthogonal to free layer 136. As magnetic vector 200' continues to precess (i.e., switch), the rotation of vector 200' extends further from the center of free layer 136, as is seen in FIG. 2b.

In most prior MTJ devices using a polarizer such as polarizer 150, the magnetization direction of polarizer 150 is fixed, which is shown in FIGS. 1 and 3. See also U.S. Pat. No. 6,532,164, which states that the direction of the magnetization of the polarizing layer cannot vary in the presence of current. Prior to current passing through the MTJ, the free layer 136 has a magnetization direction 200 perpendicular to that of the polarizer 150. While the magnetization direction 200 of the free layer 136 can rotate by 180 degrees, such rotation is normally precluded by the free layer's inherent damping ability 205, which is represented by a vector 205 pointing to axis 202 (shown as a dashed line in FIG. 2a as well as FIG. 3). Axis 202 is perpendicular to the plane of free layer 136. This damping 205 has value, defined by the damping constant, which maintains the magnetization direction of the free layer 136.

The precession of the magnetization vector during switching of the free layer can be assisted by spin transfer torque exerted by the electrons of a spin-polarized current, which is generated in part by the orthogonal polarizer 150. Applying a current to the MTJ device 100 produces a spin-polarized current, which exerts a spin transfer torque on the magnetic vector 200. This spin transfer torque has an in-plane component of the spin transfer torque 210, which pushes magnetization vector 200' in the direction of the magnetic vector of polarizer 150 throughout precession of magnetic vector 200'. In addition to the in-plane spin transfer torque 210 from the polarizer, the perpendicular spin transfer torque (not shown), generated by reference layer 132, pulls the magnetic vector 200' towards the direction antiparallel to its initial direction 200, thereby causing switching of the free layer 136. In devices like those shown in FIG. 1, when the spin transfer torque 210 begins to help overcome the damping 205 inherent to the free layer 136, the magnetic direction 200' begins to precess about its axis, as shown in FIG. 2a. As seen in FIG. 3, in-plane spin transfer torque 210 helps the magnetization direction of the free layer 136 to precess in a cone-like manner around an axis 202 perpendicular to the plane of the layers. When a spin polarized current traverses the stack 100, the magnetization of the free layer 136 precesses in a continuous manner (i.e., it turns on itself in a continuous manner as shown in FIG. 3) with maintained oscillations until the magnetic direction of free layer 136 is opposite the magnetic direction prior to the spin torque causing precession, i.e., the magnetic direction of free layer 136 switches by 180 degrees.

FIG. 3 illustrates the precession of a free layer 136 of an MTJ assisted by orthogonal spin polarized current. The spin polarized electrons from polarizer 150 provide a spin transfer torque which has a component 210 in the plane of the precession (i.e., in-plane spin transfer torque) that helps overcome the damping 205 in the first half of the precession 215 because the in-plane spin transfer torque 210 provided by the spin polarized current is opposite that of the inherent damping 205 of the free layer 136. This is shown on the right-hand side of the middle portion of FIG. 3, which illustrates the projection of spin transfer torque 210 onto the precession plane (i.e., the plane defined by axis 200 and magnetization vector 200' as it steadily precesses around axis 200). However, the in-plane spin transfer torque actually harms the switching process during the second half of the precession 220. The reason for this is that the spin of the electrons in the spin polarized current only apply an in-plane spin transfer torque 210 in the direction of their polarization, which is aligned with the magnetic direction of the in-plane polarization layer 150. Thus, when the magnetic vector is in the half of the precession cycle 220 that is opposite the spin of the polarized electrons, the in-plane spin transfer torque 210 actually works with the inherent damping 205 of free layer 136 to make rotation more difficult. This is shown in the left-hand side of the middle portion of FIG. 3 and can be seen in the projection of the spin transfer torque 210 onto the precessional plane of the free layer 136, which is depicted on the bottom of FIG. 3. Indeed, it is the perpendicular spin transfer torque created by the reference layer 132 (not shown in FIG. 3) that overcomes the damping 205 of free layer 136 as well as the in-plane spin transfer torque 210 during the half of a precession cycle where the spin of the electrons harms precession, and thus it is the reference layer 132 that allows for completion of precession. The precessional dynamics and the directionality of the spin transfer torque depicted in FIG. 3 are approximations for the dynamics that occur at very low magnetization angles and do not necessarily reflect the phenomena occurring at larger magnetization angles.

One solution that has been proposed to overcome this limitation is the use of a precessional spin current ("PSC") magnetic layer having a magnetization vector that can freely rotate in any magnetic direction, shown in FIGS. 4a-b. The free layer 336 is similar to the free layer 136 previously discussed, in that it has an inherent damping characteristic 205 that can be overcome with the assistance of spin transfer torque. However, the polarizing layer 150 is replaced with a precessional magnetic layer 350. As seen in FIG. 4a, which shows the projection onto the precessional plane of the direction of the spin transfer torque 211 created by spin current passing through free layer 336, the direction of spin transfer torque 211 changes with the rotation of PSC magnetic layer 350. As seen on the right side of FIG. 4a, spin transfer torque 211 causes the magnetization direction 200' of the free layer 336 to precess in a cone-like manner around an axis 202 perpendicular to the plane of the layers. The PSC layer 350 and the free-layer 336 are magnetically and/or electronically coupled such that the magnetization direction of the magnetization vector 270 of the PSC magnetic layer 350 follows the precessional rotation of the magnetic vector of the free layer 336.

As seen in on the right-hand side of FIG. 4a, the spin polarized electrons provide torque 211 that helps to overcome the damping 205 in the first half of the precession 215 because the torque 211 provided by the spin polarized current is opposite that of the inherent damping 205 of the free layer 336. In addition, torque 211 helps to overcome the damping 205 in the second half of the precession 220 by the same mechanism. Thus, unlike prior devices having a fixed polarization magnetic layer 150, the spin of the electrons in the spin polarized current applies a torque 211 in both halves of the precession cycle, including the half of the precession cycle 220 where devices with fixed polarization magnetic layers 150 actually harmed precession. As is seen, the torque 211 continues to help overcome the inherent damping 205 of free layer 136 throughout the entire precession cycle. An MRAM device utilizing an MTJ structure with a PSC is depicted in FIG. 5.

However, because of the chirality of perpendicular MTJ structures that utilize a PSC, such as the structure shown in FIG. 5, the PSC only enhances switching of the free layer in one direction (i.e., from the parallel state to the anti-parallel state, FIG. 4a), but not the other (i.e., from the antiparallel state to the parallel state, FIG. 4b). As discussed above, when switching the free layer 336 from the first direction to the second direction, the spin current is generated by the electrons passing through the PSC layer and the in-plane spin transfer torque 211 is in line with the magnetic vector of the PSC layer (FIG. 4a). However, during switching free layer 336 from the second direction to the first direction, it is the reflected spin current from PSC layer that imparts the in-plane spin transfer torque 211' on the free layer 336. As shown in FIG. 4b, the in-plane spin transfer torque 211' caused by the reflected spin current is in the direction anti-parallel to the magnetic vector 270 of the PSC layer 350. When the magnetic vector 270 is aligned with the magnetic vector 200', the in-plane spin transfer torque 211' might actually enhance the damping characteristic 205 of the free layer 336. Therefore, when the precession of magnetic vector 270 of the PSC layer 350 is synchronized with the precession of the magnetic vector 200 of the free layer 336, the in-plane spin transfer torque 211' might enhance the damping characteristic 205 throughout the entire precession 220'. Thus, the PSC layer can be highly effective at increasing the switching efficiency of the free layer in one direction, but may actually hamper switching in the other direction.

Thus, in prior devices that utilize in-plane polarization layers 150 having a fixed magnetization direction and having a free magnetic layer 136 with a magnetization vector that is perpendicular to the plane of the device, once the precession holds, the in-plane spin transfer torque has no net positive effect on the switching mechanism for a full three hundred sixty degree precession. Moreover, in prior devices that utilize a PSC magnetic layer 350, the in-plane spin transfer torque enhances the switching of the free layer throughout the precession from the first direction to the second direction, but might not enhance the switching of the free layer from the second direction to the first direction.

Therefore, there is a need for a spin torque transfer device that reduces the amount of current needed for switching from both magnetization directions while also switching at high speeds and requiring reduced chip area.

SUMMARY

An MRAM device is disclosed that has a magnetic tunnel junction stack having a significantly improved performance of the free layer in the magnetic tunnel junction structure that requires significantly lower switching currents and which significantly reduces switching times for MRAM applications and maintains this characteristic for both switching directions (AP to P and P to AP)

In one embodiment, a method for inducing a change in a magnetization vector in a magnetic device includes a magnetic device that includes a reference magnetic layer in a first plane. The reference magnetic layer has a magnetization vector that is perpendicular to the first plane and has a fixed magnetization direction. The magnetic device also has a non-magnetic tunnel barrier layer in a second plane and disposed over the reference magnetic layer. The magnetic device also includes a free magnetic layer in a third plane and disposed over the non-magnetic tunnel barrier layer. The free magnetic layer has a magnetization vector that is perpendicular to the third plane and has a magnetization direction that can switch from a first magnetization direction to a second magnetization direction and from the second magnetization direction to the first magnetization direction. The switching process involves precessions of the magnetization vector around an axis perpendicular to the third plane at a precession radius. The magnetization vector of the free magnetic layer has a predetermined precession frequency. The magnetic device also includes a non-magnetic spacer in a fourth plane and disposed over the free magnetic layer. The magnetic device also includes an in-plane polarization magnetic layer in a fifth plane and disposed over the non-magnetic spacer. The in-plane polarization magnetic layer has a magnetization vector that is parallel to the fifth plane. The method includes generating a programming current pulse. The programming current pulse comprises a constant DC pulse and an alternating perturbation pulse. The constant DC pulse has a constant DC pulse current value and the alternating perturbation pulse alternates between a maximum current value and a minimum current value at a first frequency. The method also includes applying the programming current pulse to the magnetic device, thereby producing a spin-polarized current having spin-polarized electrons. The spin-polarized current alternates between a maximum spin-current value and a minimum spin-current value at the first frequency. The method also includes injecting the spin-polarized current having spin-polarized electrons into the free magnetic layer, thereby exerting a spin transfer torque on the magnetization vector of the free magnetic layer. The spin transfer torque has a perpendicular spin torque component and an in-plane spin torque component. The in-plane spin torque component assists the perpendicular spin-torque component in switching the magnetic direction of the free magnetic layer. The in-plane component of the spin transfer torque alternates between a maximum magnitude and a minimum magnitude at the first frequency. The first frequency is synchronized with the predetermined precession frequency of the free magnetic layer thereby causing the in-plane spin torque component to be a the maximum magnitude when the in-plane spin torque component increases the precession radius of the magnetization vector of the free magnetic layer and at the minimum magnitude when the in-plane spin torque component decreases the precession radius of the magnetization vector of the free magnetic layer. In this way, the switching process of the free magnetic layer is improved from the first magnetization direction to the second magnetization direction and from the second magnetization direction to the first magnetization direction.

In another embodiment, a difference in frequency between the first frequency and the predetermined precession frequency of the free magnetic layer is less than twenty percent of the predetermined precession frequency of the free magnetic layer.

In another embodiment, a difference in frequency between the first frequency and the predetermined precession frequency of the free magnetic layer is less than ten percent of the predetermined precession frequency of the free magnetic layer.

In another embodiment, a difference in frequency between the first frequency and the predetermined precession frequency of the free magnetic layer is less than five percent of the predetermined precession frequency of the free magnetic layer.

In another embodiment, a difference in frequency between the first frequency and the predetermined precession frequency of the free magnetic layer is less than two percent of the predetermined precession frequency of the free magnetic layer.

In another embodiment, the alternating perturbation current pulse comprises an alternating current and direct current that are passed through the magnetic device simultaneously.

In another embodiment, a difference between the maximum current value and the minimum current value is less than or equal to 100% of the constant DC pulse current value.

In another embodiment, a difference between the maximum current value and the minimum current value is less than or equal to 50% of the constant DC pulse current value.

In another embodiment, a difference between the maximum current value and the minimum current value is less than or equal to 25% of the constant DC pulse current value.

In another embodiment, a difference between the maximum current value and the minimum current value is less than or equal to 10% of the constant DC pulse current value.

In another embodiment, a difference between the maximum current value and the minimum current value is less than or equal to 5% of the constant DC pulse current value.

In another embodiment, a method for inducing a change in a magnetization vector in a magnetic device includes a magnetic device that includes a magnetic tunnel junction (MTJ) in a first plane. The MTJ comprises a reference magnetic layer, a non-magnetic tunnel barrier layer, and a free magnetic layer. The free magnetic layer and the reference magnetic layer are separated by the non-magnetic tunnel barrier layer. The reference magnetic layer has a magnetization vector that is perpendicular to the first plane and has a fixed magnetization direction. The free magnetic layer has a magnetization vector that is perpendicular to the first plane and has a magnetization direction that can switch from a first magnetization direction to a second magnetization direction and from the second magnetization direction to the first magnetization direction. During the switching process, the magnetization vector of the free layer precesses around an axis perpendicular to the first plane. The magnetization vector of the free magnetic layer has a predetermined precession frequency. The magnetic device also includes a non-magnetic spacer in a second plane. The non-magnetic spacer separates the magnetic tunnel junction from an in-plane polarization magnetic layer in a third plane. The in-plane polarization magnetic layer has a magnetization vector that is parallel to the third plane. The method also includes generating a programming current pulse, which comprises an alternating perturbation pulse. The alternating perturbation pulse alternates between a maximum current value and a minimum current value at a first frequency. The method also includes applying the programming current pulse to the magnetic device, thereby producing a spin-polarized current having spin-polarized electrons. The spin-polarized current alternates between a maximum spin-current value and a minimum spin-current value at the first frequency. The method also includes injecting the spin-polarized current having spin-polarized electrons into the free magnetic layer, thereby exerting a spin transfer torque on the magnetization vector of the free magnetic layer. The method also includes switching the magnetization vector of the free magnetic layer from the first magnetization direction to the second magnetization direction or from the second magnetization direction to the first magnetization direction. In another embodiment, the first frequency is synchronized with the predetermined precession frequency of the free magnetic layer, thereby modifying the magnitude of the spin transfer torque on the magnetization vector of the free layer to enhance the efficiency of the switching process.

In another embodiment, the programming current pulse further comprises a direct current pulse having a direct current value.

In another embodiment, the direct current value is fixed throughout the switching process.

In another embodiment, a magnetic device includes a magnetic tunnel junction in a first plane. The magnetic tunnel junction includes a reference magnetic layer, a non-magnetic tunnel barrier layer, and a free magnetic layer. The free magnetic layer and the reference magnetic layer are separated by a non-magnetic tunneling barrier layer. The free magnetic layer has a magnetization vector that is perpendicular to the first plane and has a magnetization direction that can switch from a first magnetization direction to a second magnetization direction and from the second magnetization direction to the first magnetization direction. During the switching process, the magnetization vector precesses around an axis perpendicular to the first plane at a precession radius. The device also includes a non-magnetic spacer in a second plane. The device also includes an in-plane polarization magnetic layer in a third plane. The non-magnetic spacer separates the magnetic tunnel junction from the in-plane polarization magnetic layer. The in-plane polarization magnetic layer has a magnetization vector that is parallel to the third plane. The device also includes a current source that directs a programming current pulse through the magnetic tunnel junction, the non-magnetic spacer and the in-plane polarization magnetic layer. The programming current pulse comprises a direct current pulse and an alternating perturbation pulse. The alternating perturbation pulse alternates between a maximum current value and a minimum current value at a first frequency. Application of the programming current pulse to the magnetic device produces a spin-polarized current having spin-polarized electrons. The spin-polarized current alternates between a maximum spin-current value and a minimum spin-current value at the first frequency. The spin-polarized electrons exert a spin transfer torque on the magnetization vector of the free magnetic layer. The spin transfer torque has a perpendicular spin torque component and an in-plane spin torque component and the in-plane spin torque component of the spin transfer torque alternates between a maximum magnitude and a minimum magnitude at the first frequency. The first frequency is synchronized with the predetermined precession frequency of the free magnetic layer thereby causing the in-plane spin torque component to be at the maximum magnitude when the in-plane spin torque component increases the precession radius of the magnetization vector of the free magnetic layer and at the minimum magnitude when the in-plane spin torque component decreases the precession radius of the magnetization vector of the free magnetic layer. In this way, the switching process of the free magnetic layer is improved from the first magnetization direction to the second magnetization direction and from the second magnetization direction to the first magnetization direction.

In another embodiment, the direct current pulse has a current value different than zero.

In another embodiment, the direct current pulse has a value that is fixed throughout the duration of the pulse.

In another embodiment, the magnetization vector of the polarization magnetic layer is fixed.

In another embodiment, the free magnetic layer comprises CoFeB.

In another embodiment, the non-magnetic tunnel barrier layer comprises MgO.

In another embodiment, the in-plane polarization magnetic layer comprises CoFeB.

In another embodiment, the in-plane polarization magnetic layer comprises an iron-containing material.

In another embodiment, the in-plane polarization magnetic layer comprises Fe, FeV, FeB, or CoFeB.

In another embodiment, the non-magnetic spacer comprises MgO.

BRIEF DESCRIPTION OF THE DRAWINGS

The accompanying drawings, which are included as part of the present specification, illustrate the presently preferred embodiments and, together with the general description given above and the detailed description given below, serve to explain and teach the principles of the MTJ devices described herein.

FIG. 1 illustrates a perpendicular MTJ stack with an orthogonal polarizer for an MRAM device.

FIG. 2 illustrates the precession of the free layer in an MTJ.

Figure 3:
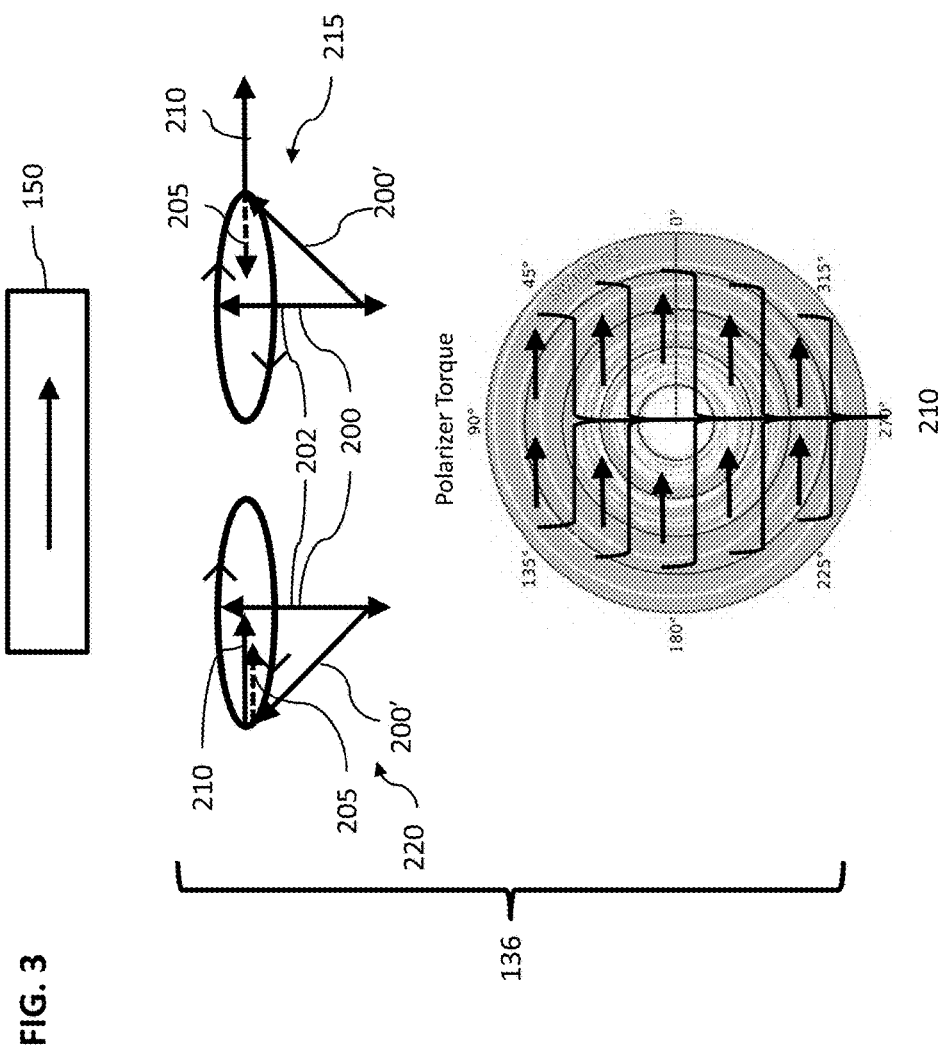
FIG. 3 illustrates the precession of the free layer in an MTJ used with a polarizing magnetic layer having a fixed magnetization direction.
Figure 4:
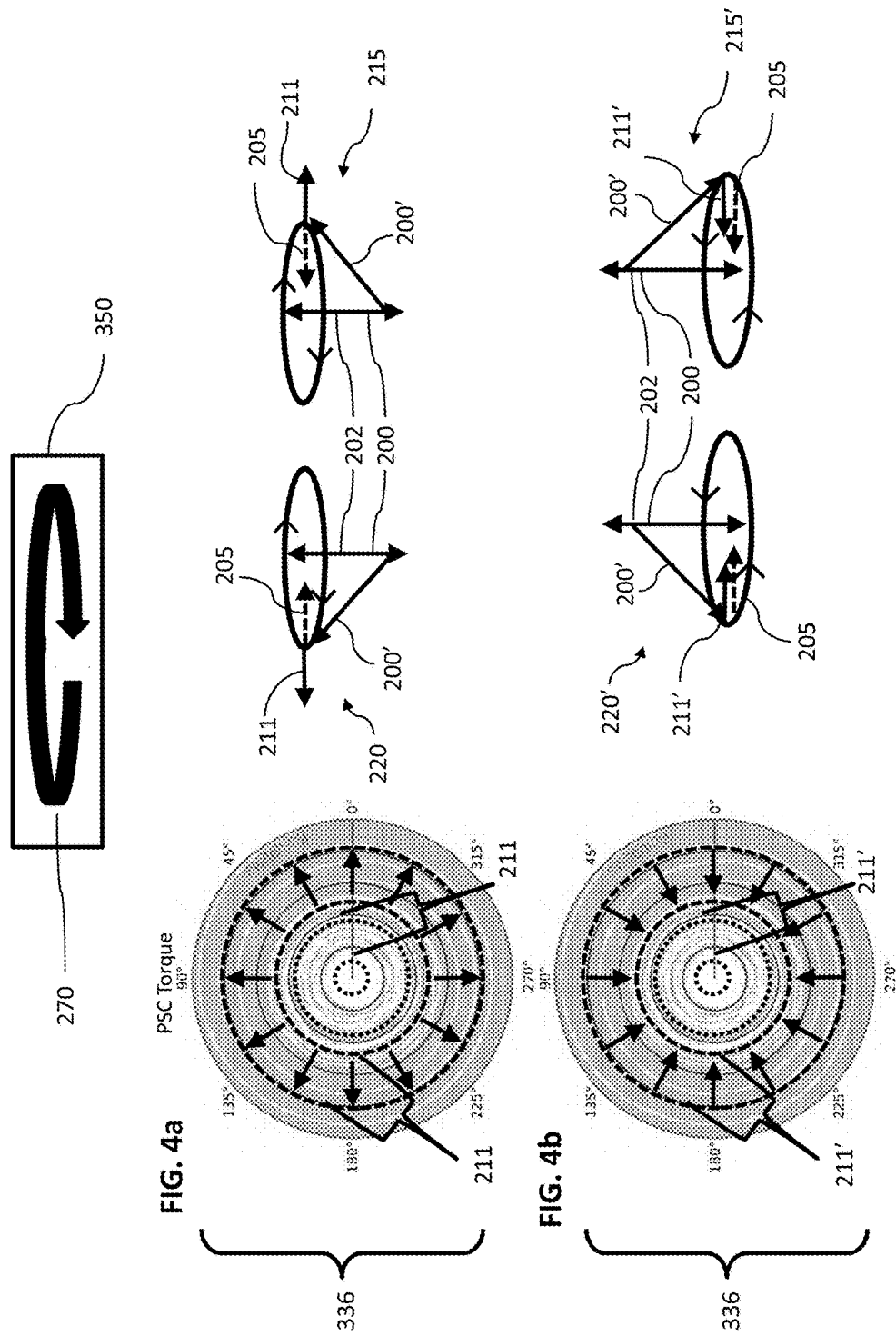
FIGS. 4a-b illustrates the precession of the free layer in an MTJ with a precessional spin current magnetic layer having a magnetization direction that rotates freely.
Figure 5:
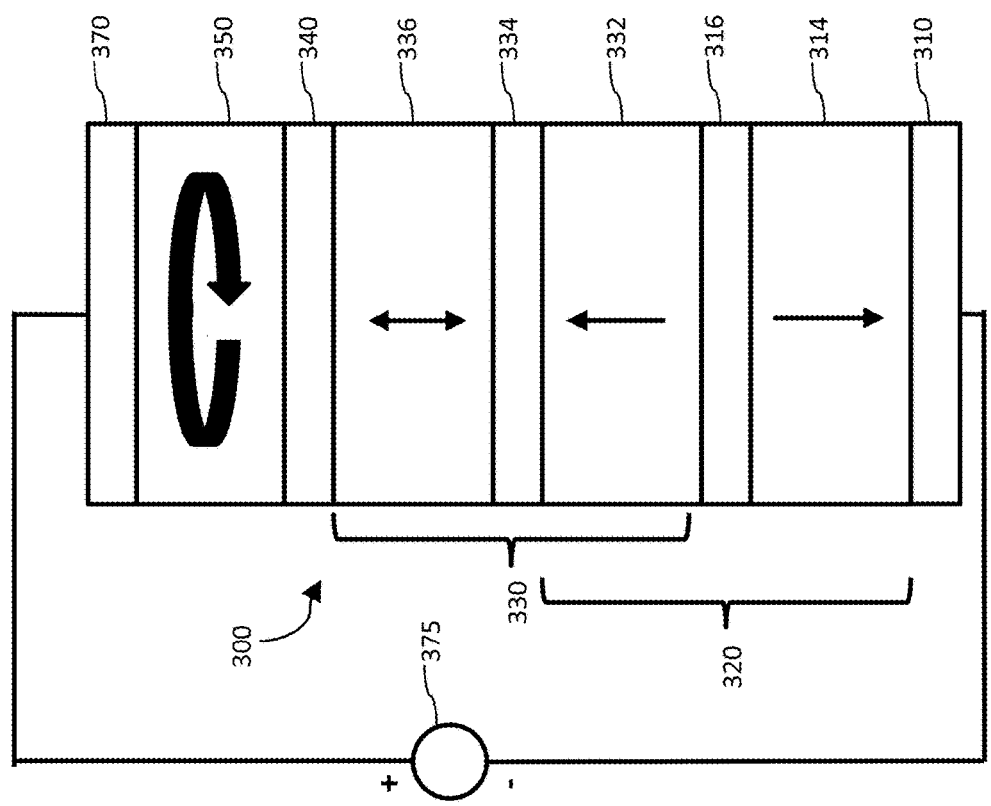
FIG. 5 illustrates an MTJ stack for an MRAM device having a precessional spin current magnetic layer.

The figures are not necessarily drawn to scale and the elements of similar structures or functions are generally represented by like reference numerals for illustrative purposes throughout the figures. The figures are only intended to facilitate the description of the various embodiments described herein; the figures do not describe every aspect of the teachings disclosed herein and do not limit the scope of the claims.

DETAILED DESCRIPTION

The following description is presented to enable any person skilled in the art to create and use methods and magnetic devices that utilize a programming current comprising an alternating perturbation current to assist in the switching of a magnetization vector for a magnetic semiconductor device such as an MRAM device. Each of the features and teachings disclosed herein can be utilized separately or in conjunction with other features to implement the disclosed system and method. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the present teachings. However, it will be apparent to one skilled in the art that these specific details are not required to practice the present teachings.

This present patent document discloses methods for switching a magnetization vector that can be used to switch the magnetization vector of a free layer in a MRAM device. The methods use a programming current that comprises an alternating perturbation current, which alternates between a maximum current value and a minimum current value at a first frequency. In one embodiment, when this programming current is applied to the in-plane polarization layer and the magnetic tunnel junction, a spin-polarized current having spin-polarized electrons is generated. The spin-polarized current alternates between a maximum spin-current value and a minimum spin-current value at the first frequency, causing the magnitude of the in-plane spin transfer torque to alternate between a maximum magnitude and a minimum magnitude. The first frequency is synchronized with the predetermined precession frequency of the magnetization vector of the free layer, such that the in-plane spin transfer torque provides a net benefit of assisting in the precessional motion of the magnetization vector, thereby enhancing the efficiency of the switching of the free layer.

The present patent document also discloses a MRAM device that uses an in-plane polarization layer having a fixed magnetization direction and a current source that directs and programming current pulse through the magnetic device, and is described with reference to FIGS. 6-12. Instead of directing only a direct current through the magnetic device, the current source directs a programming current pulse that comprises an alternating perturbation current. In one embodiment, the programming current pulse comprises an alternating perturbation pulse and a direct current. Application of this programming current pulse to the magnetic device generates a spin-polarized current having spin polarized electrons that alternates between a maximum spin-current value and a minimum spin-current value at a first frequency. The spin-polarized electrons exert a spin transfer torque on the magnetization vector of the free magnetic layer, thereby assisting in the switching of the magnetization direction of the free layer. The first frequency is synchronized with the predetermined precession frequency of the magnetization vector of the free layer, such that the in-plane spin torque component provides a net benefit of assisting in the precessional motion of the magnetization vector, thereby enhancing the efficiency of the switching of the free layer.

Figure 6:
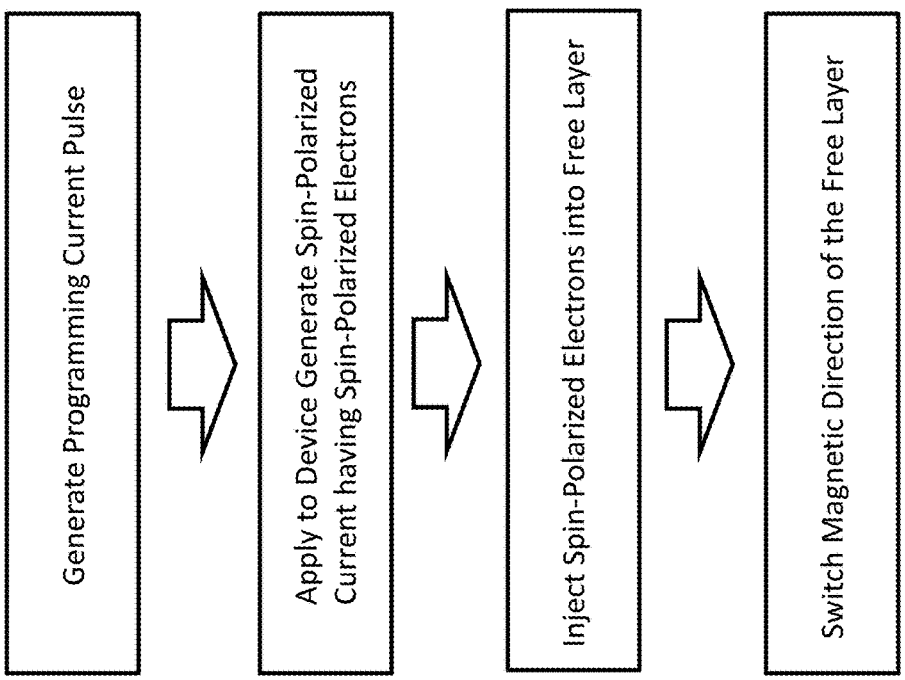
FIG. 6 illustrates a method for switching the magnetization vector of the free layer in an MTJ using a fixed polarizer and a programming current pulse comprising an alternating perturbation current.

FIG. 6 shows a schematic for one method of switching a free layer using a programming current pulse comprising an alternating perturbation current. In one embodiment, the first step of the method is the generation of a programming current pulse. The programming current pulse comprises an alternating perturbation current. In one embodiment, the programming current pulse also comprises a direct current. Second, the programming current is applied to a magnetic device. In one embodiment, the magnetic device 500 comprises a perpendicular MTJ 530 with an in-plane polarizer 550. Application of the current to the magnetic device results in a spin-polarized current having spin-polarized electrons. Third, the spin-polarized electrons are injected into the free layer 536 of the MTJ 530. The spin-polarized electrons exert a spin transfer torque on the magnetic vector of the free layer 536. Fourth, the magnetic vector of the free layer 536 is switched to the magnetic direction opposite the magnetic direction prior to the application of the spin transfer torque, i.e., the magnetic direction of free layer 536 switches by 180 degrees. The efficiency of this switching process is enhanced by the spin transfer torque acting on the magnetic vector of the free layer 536.

The programming current alternates between a maximum current value and a minimum current value because the programming current comprises an alternating perturbation current. In one embodiment, the frequency at which the alternation occurs is be set to match the precession frequency of the magnetic vector of the free layer 536 while the precession frequency is near its maximum value. Thus, the programming current will oscillate between the maximum and minimum current values in a manner that is synchronized with the precession of the magnetization vector of the free layer 536. As described above, when the programming current is applied to a magnetic device, such as magnetic device 500 comprising an in-plane polarization layer 550 and a perpendicular MTJ 530, a spin-polarized current is formed. As the programming current alternates between a maximum and minimum current levels, the spin-polarized current also alternates between a maximum spin-current value and a minimum spin-current value. The magnitude of the spin-transfer torque exerted on the free layer 536 is proportional to the spin-current value. Therefore, when the spin current is at the maximum spin-current value, the magnitude of the spin-transfer torque being exerted on the free layer 536 is at the maximum magnitude. When the spin current is at the minimum spin-current value, the magnitude of the spin-transfer torque being exerted on the free layer 536 is at the minimum magnitude. Therefore, in embodiments where the oscillation frequency of the programming current in synchronized with the precession frequency of the magnetization vector of the free layer 536, the magnitude of the spin transfer torque will alternate between the maximum magnitude and minimum magnitude at a frequency that is also synchronized with the precession of the free layer 536.

Figure 7A:
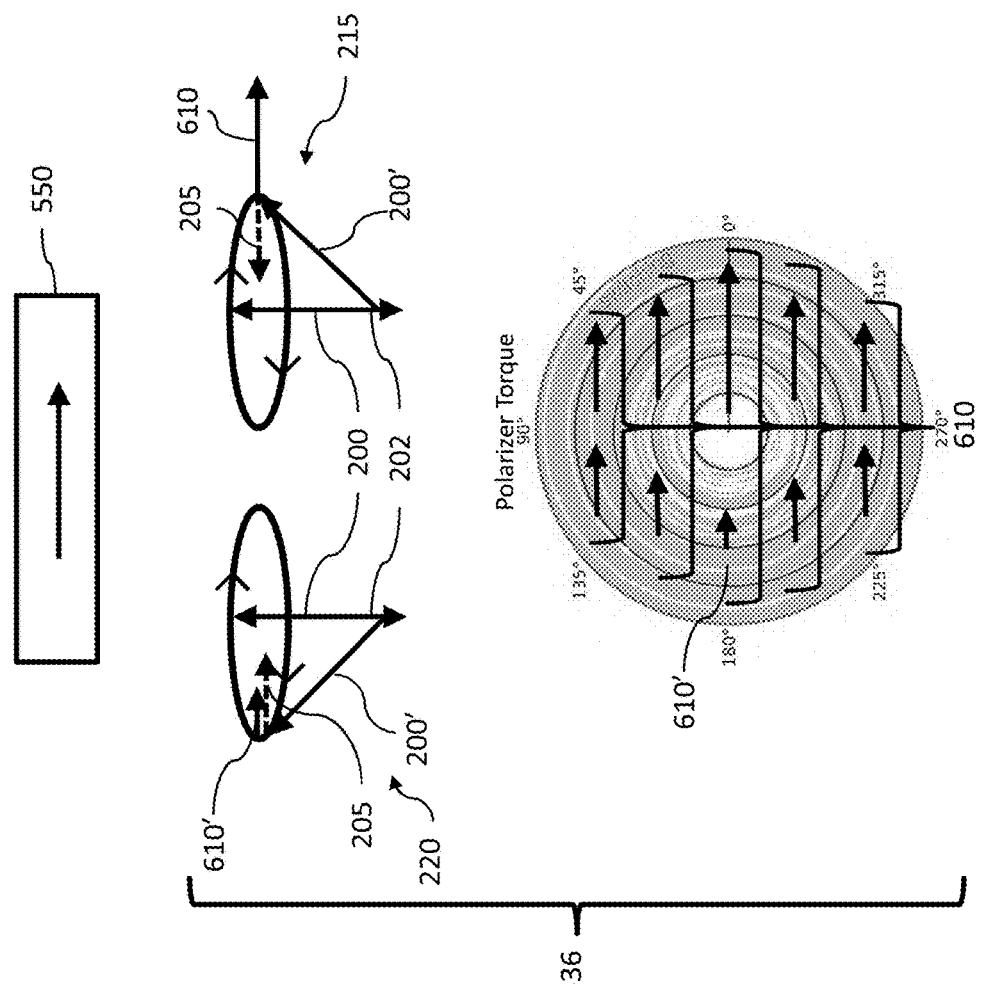
FIGS. 7a-7b illustrates the precession of the free layer in an MTJ with a polarizing magnetic layer having a fixed magnetization direction that utilizes a programming current pulse comprising an alternating perturbation current.
Figure 7B:
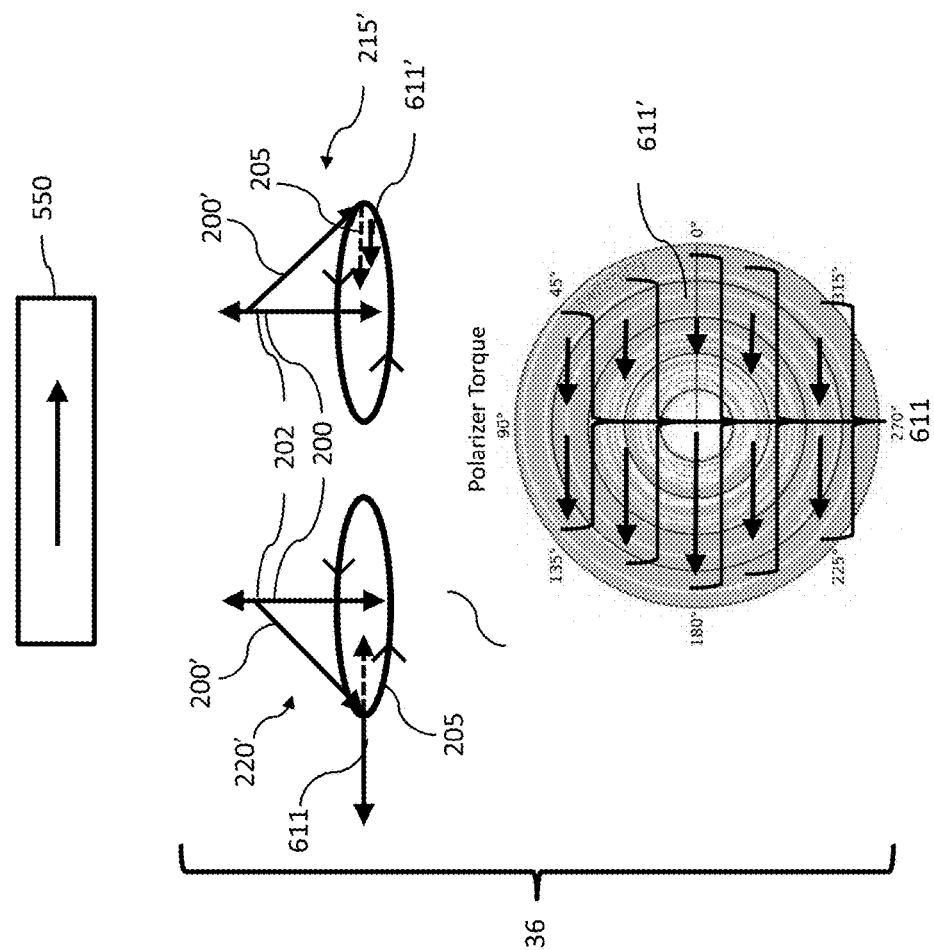

FIGS. 7a and 7b shows the concept behind methods and devices that use a programming current pulse comprising an alternating perturbation current and an in-plane polarization layer 550. Like in-plane polarizer 150 previously discussed, the in-plane polarization layer 550 in this embodiment has a magnetic vector with a fixed magnetization direction (top of FIG. 7a). The free layer 536 in this embodiment is similar to the free layer 136 previously discussed, in that it has an inherent damping characteristic 205 that can be overcome with the assistance of spin transfer torque. As seen in the middle of FIG. 7a, in-plane spin transfer torque 610 causes the magnetization direction 200' of the free layer 536 to precess in a cone-like manner around an axis 202 perpendicular to the plane of the layers. FIG. 7a shows a progression of rotation of the magnetic direction 200' about axis 202. As discussed, when a spin polarized current traverses the device, the magnetization of the free layer 536 precesses in a continuous manner (i.e., it turns on itself in a continuous manner as shown in the middle of FIG. 7a) with maintained oscillations until the magnetic direction of free layer 536 is opposite the magnetic direction prior to the spin torque causing precession, i.e., the magnetic direction of free layer 136 switches by 180 degrees.

The spin-polarized electrons of the spin-polarized current exert a spin transfer torque on the magnetization layer of the free layer. This spin transfer torque has both an in-plane spin torque component 610 and a perpendicular spin torque component (not shown in FIG. 7a). The perpendicular spin torque exerts a force on the magnetization vector of the free layer that pulls the magnetization vector from one perpendicular position to the other perpendicular position (e.g. from the parallel to the anti-parallel state). This perpendicular spin torque component is caused by spin-polarization of the electrons by the reference magnetic layer 532 (depicted in FIG. 8). The in-plane spin torque 610 assists in the switching of the free layer by providing a force that pushes the magnetization vector away from the perpendicular axis 202, allowing the perpendicular spin transfer torque to act on the magnetization vector, thereby switching the free layer. This in-plane spin torque 610 is caused by spin-polarization of the electrons by the in-plane polarization magnetic layer 550.

The in-plane spin torque 610 also enhances the precessional motion of the magnetization vector of the free layer. As seen in on the right-hand side of FIG. 7a, the spin-polarized electrons provide in-plane spin torque 610 that helps to overcome the damping 205 in the first half of the precession 215 because the in-plane spin torque 610 provided by the spin-polarized current is opposite that of the inherent damping 205 of the free layer 536. During the first half of the precession, the spin-polarized current is at or near the maximum current value, thereby imparting in-plane spin transfer torque 610 at or near the maximum spin-torque magnitude (depicted by the longer arrow). As previously discussed, during the second half of the precession 215, this in-plane spin torque 610' is actually aligned with the inherent damping of the free layer 536. However, in one embodiment, during the second half of the precession, the spin-polarized current is at or near the minimum current value, thereby imparting in-plane spin transfer torque 610' at or near the minimum spin-torque magnitude (depicted by the shorter arrow). The oscillation frequency of the alternating perturbation current is set at a first frequency, which is synchronized with the predetermined precession frequency of the free layer. Therefore, the magnitude of in-plane spin transfer torque is maximized (FIG. 7a, 610) when it enhances the precessional motion of the free layer and is minimized (FIG. 7a, 610') when the in-plane spin transfer torque opposes the precessional motion (bottom of FIG. 7a). Thus, the in-plane spin torque component provides a net benefit of assisting in the precessional motion of the magnetization vector, thereby enhancing the efficiency of the switching of the free layer.

Moreover, as shown in FIG. 7b, the use of a programming current comprising an alternating perturbation current can provide net enhancement of precession throughout the switching of the free layer 536 from both the first magnetization direction and the second magnetization direction (i.e., switching of the free layer from both the parallel direction to the antiparallel direction and from the antiparallel direction to the parallel direction). During switching of the free layer 536 from the second magnetic direction to the first magnetic direction, it is the reflected spin current generated by the in-plane polarizer that exerts the in-plane spin transfer torque 611 on the free layer 536. As discussed above, the direction of the in-plane spin transfer torque 611 exerted by the reflected spin current is antiparallel to the magnetic direction of the in-plane polarizer 550 (top of FIG. 7b). Nevertheless, the alternating perturbation current can be synchronized with the predetermined precession frequency of the magnetization vector 200' of the free magnetic layer in such a way as to maximize the in-plane spin transfer torque 611 when it opposes the damping force 205 and minimize the in-plane spin transfer torque 611' when it enhances the damping force 205 (middle of FIG. 7b). Thus, synchronization of the alternating perturbation current with the precession frequency of the free layer can be accomplished regardless of the direction of the current, achieving a net enhancement of the precessional motion during switching of free layer 536 in both directions.

Figure 8:
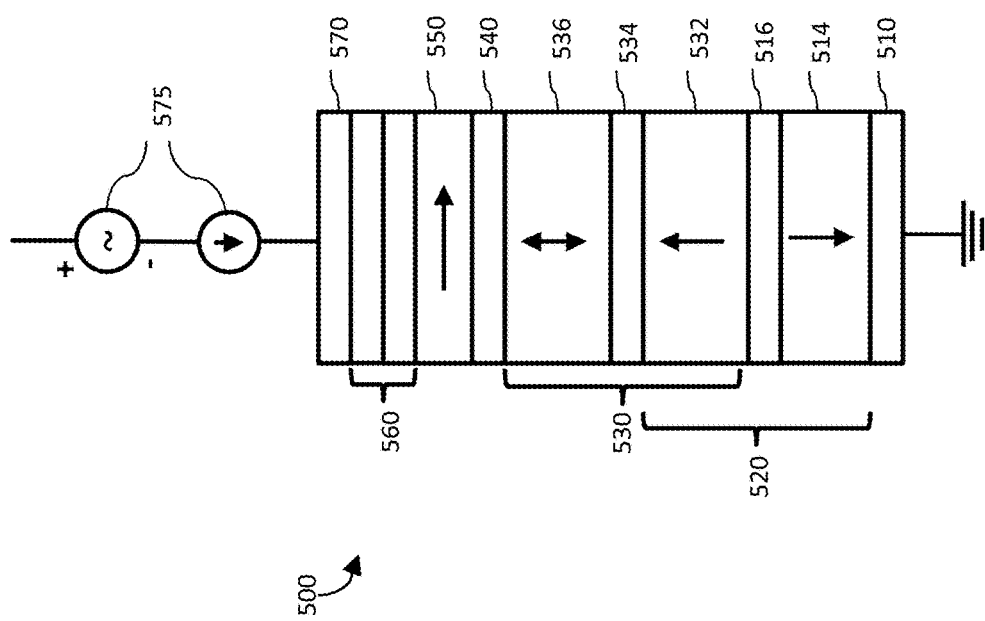
FIG. 8. illustrates an MTJ stack for an MRAM device utilizing a polarizing magnetic layer having a fixed magnetization direction that utilizes a programming current pulse comprising an alternating perturbation current.

A memory cell with an in-plane polarization layer 550, an MTJ structure 500, and a programming current source 575 is shown in FIG. 8. MTJ structure 500 includes one or more seed layers 510 provided at the bottom of stack 500 to initiate a desired crystalline growth in the above-deposited layers. Synthetic antiferromagnetic (SAF) layer 520 is disposed over seed layer 510. SAF layer 520 is comprised of a first SAF layer 532, anti-ferromagnetic coupling layer 516 and second SAF layer 514. Second SAF layer 514 is deposited over seed layer 510, while anti-ferromagnetic coupling layer 516 is placed over second SAF layer 314. MTJ 530 is deposited over anti-ferromagnetic coupling layer 516. MTJ 530 includes first SAF layer 532, which acts as the reference layer of the MTJ, and is also part of SAF layer 520. A tunneling barrier layer (i.e., the insulator) 534 is disposed over first SAF layer 532 while the free layer 536 is disposed over tunneling barrier layer 534. As shown in FIG. 8, the magnetization vector of first SAF layer 532 has a magnetization direction that is preferably perpendicular to its plane, although variations of a several degrees are within the scope of what is considered perpendicular. As also seen in FIG. 8, free layer 536 also has a magnetization vector that is preferably perpendicular to its plane, but its direction can vary by 180 degrees. A nonmagnetic spacer 540 is disposed over MTJ 530. In-plane polarization magnetic layer 550 is disposed over nonmagnetic spacer 540. In one embodiment, in-plane polarization magnetic layer 550 has a magnetization vector having a magnetic direction parallel to its plane, and is perpendicular to the magnetic vector of the reference layer 532 and free layer 536. In-plane polarization magnetic layer 550 has a magnetization direction that is preferably parallel to its plane, although variations of a several degrees are within the scope of what is considered parallel. One or more capping layers 570 can be provided on top of in-plane polarization magnetic layer 550 to protect the layers below on MTJ stack 500. In one embodiment, current source 575 generates an alternating perturbation current to the MTJ that has an oscillation frequency that is synchronized with the precession frequency of magnetization vector of free layer 536.

Seed layer 510 in the MTJ structure shown in FIG. 8 preferably comprises Ta, TaN, Cr, Cu, CuN, Ni, Fe or alloys thereof. Second SAF layer 514 preferably comprises either a Co/Ni, Co/Pt or Co/Pd multilayer structure. First SAF layer 532 preferably comprises either a Co/Ni or Co/Pt multilayer structure plus a thin non-magnetic layer comprised of tantalum having a thickness of two to five Angstroms and a thin CoFeB layer (0.5 to three nanometers). Anti-ferromagnetic coupling layer 516 is preferably made from Ru having thickness in the range of three to ten Angstroms. Tunneling barrier layer 534 is preferably made of an insulating material such as MgO, with a thickness of approximately ten Angstroms. Free layer 536 is preferably made with CoFeB deposited on top of tunneling barrier layer 534. Free layer 536 can also have layers of Fe, Co, Ni or alloys thereof and W and Ta insertion layers to promote perpendicular anisotropy. Spacer layer 540 over MTJ 530 can be any non-magnetic material such as 2 to 20 Angstroms of ruthenium, 2-20 Angstroms of Ta, 2-20 Angstroms of TaN, 2-20 Angstroms of Cu, 2-20 Angstroms of CuN, or 2-20 Angstroms MgO layer, or or 2-20 Angstroms Al2O3 layer.

Nonmagnetic spacer 540 has a number of properties. For example, nonmagnetic spacer 540 physically separates the free layer 536 and the in-plane polarization magnetic layer 550. Nonmagnetic spacer 540 transmits spin current efficiently from the in-plane polarization magnetic layer 550 into the free layer 536 because it preferably has a long spin diffusion length if made metallic. Nonmagnetic spacer 540 also promotes good microstructure and high tunneling magnetoresistance (TMR) and helps keep the damping constant of the free layer 536 low. In one embodiment, nonmagnetic space 540 comprises MgO.

The in-plane polarization magnetic layer 550 is preferably made from CoFeB. It can also be made with Co, Fe, Ni magnetic layers or can be made out of their alloys. The magnetic alloys can also have boron, tantalum, copper or other materials. Finally capping layer 570 can be any material that provides good interface to the in-plane layer such as Ta, TaN, Ru, MgO, Cu, etc.

In some embodiments, current source 575 can generate a programming current pulse that comprises both an alternating perturbation current and a direct current component. In addition, current source 575 can be configured to produce an alternating perturbation current having an oscillation frequency that is matched to the predetermined precession frequency of the free magnetic layer 536. Current source 575 can also generate programming currents with various ratios of alternating perturbation current and direct current.

The manner in which a bit is written using a programming current pulse comprising an alternating perturbation current and MTJ structure 500 will now be described. In particular, an electrical current is supplied, for example, by current source 575, which passes electrical current through the in-plane polarization magnetic layer 550, the non-magnetic spacer 540, the free magnetic layer 536, the non-magnetic tunneling barrier layer 534, and the reference layer 532. Application of the electrical current (i.e., programming current) to the MTJ structure creates a spin polarized current that passes through non-magnetic spacer layer 540, free magnetic layer 536, tunneling barrier layer 534, and reference magnetic layer 532. The spin polarized current exerts a spin transfer torque on free magnetic layer 536, which helps overcome the inherent damping of the magnetic material making up the free layer 536. The spin transfer torque is composed of an in-plane spin transfer torque and a perpendicular spin transfer torque. In one embodiment, when switching the free layer 536 in one direction (e.g., from the parallel direction to the anti-parallel direction), the in-plane spin transfer torque is caused by the transverse spin current generated by the in-plane polarization magnetic layer 550 and the perpendicular spin transfer torque is caused by the reflected spin current generated by the reference magnetic layer 532. This causes the free magnetic layer 536 to precess about its axis, which is shown in FIG. 7a.

The programming current pulse comprises an alternating perturbation current generated, for example, by current source 575. Therefore, the programming current alternates between a maximum current value and a minimum current value at a first frequency. As a result, the spin-polarized current, which is generated by application of the programming current to MTJ structure 500, alternates between a maximum spin-current value and a minimum spin current value at the same first frequency. The magnitude of the spin transfer torque exerted on the magnetic vector of the free layer 536 is proportional to the spin-current value because at higher spin-current values, there are more spin-polarized electrons flowing through free layer 536. Therefore, the magnitude of the spin transfer torque alternates between a maximum spin torque magnitude and a minimum spin torque magnitude at the same first frequency.

The in-plane spin transfer torque causes the magnetic vector of the free magnetic layer 536 to precess, as depicted in FIG. 7a. The precession of the magnetic vector of free magnetic layer 536 occurs at a predetermined precession frequency. In some embodiments, the alternating perturbation current is synchronized with the predetermined precession frequency. Because the magnitude of the in-plane spin transfer torque alternates between the maximum spin torque magnitude and the minimum spin torque magnitude at the first frequency, these magnitude oscillations are also synchronized with the predetermined precession frequency. As depicted in FIG. 7a (middle, right), the in-plane spin transfer torque is at or near the maximum spin torque magnitude when the in-plane spin transfer torque opposes the inherent damping of the free magnetic layer 536. Also shown in FIG. 7a. (middle left), the in-plane spin transfer torque is at or near the minimum spin torque magnitude when the in-plane spin transfer torque enhances the inherent damping of the free magnetic layer 536. Therefore, the in-plane spin transfer torque from in-plane polarizer 550 provides a net spin torque throughout the precession that opposes the damping characteristic of the free magnetic layer 536. The in-plane spin transfer torque from the in-plane polarization layer 550 thereby assists the perpendicular spin transfer torque from the reference layer 532 in switching the magnetization direction of the free layer. Thus, devices using a programming current pulse comprising an alternating perturbation current can enhance the efficiency of the switching of the magnetic direction of the free magnetic layer 536.

In particular, the structures and methods described herein utilize an alternating perturbation current that is synchronized with the predetermined precession frequency of the free magnetic layer 536 that provides a net in-plane spin transfer torque throughout the whole precession cycle and therefore significantly enhances the free layer switching process in both switching directions, which will result in faster write times and lower switching threshold currents.

Figure 9:
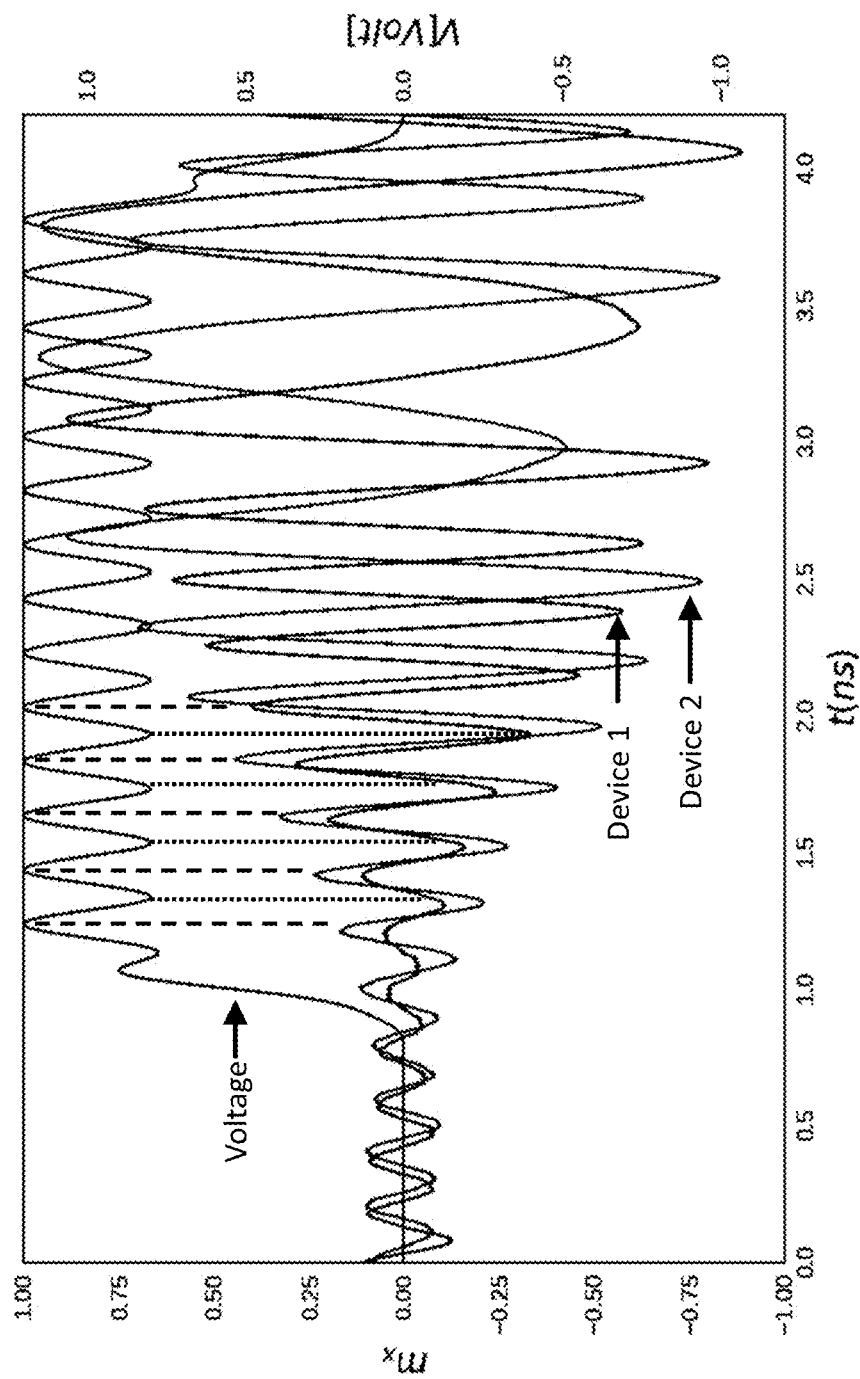
FIG. 9 is a graph that depicts the x-component of the magnetization vectors of two free layers corresponding to two different devices during their precessions following the application of a programming current pulse (also shown) comprising an alternating perturbation current, which is synchronized with the precession frequency of the free layers.

The results of simulating two devices having the structure described herein are seen in FIG. 9. In FIG. 9, the X axis of the graph depicts the time course of the simulation in nanoseconds. The right axis of the graph corresponds to voltage applied to the free layer by the programming current, which is depicted as the line labeled as "Voltage". The Voltage line indicates the voltage value of the programming current throughout the course of the simulation. The left axis of the graph corresponds to the magnitude of the x-component of the magnetization vectors ($m_x$, i.e., one of the two in-plane axes of the magnetization vector) for two devices: Device 1 (line labeled as "Device 1") and Device 2 (line labeled as "Device 2"). As the $m_x$ value approaches 1, the magnetization vector of the free layer approaches the equator (i.e., in-plane precession) and a $m_x$ value close to 0 is indicative of the magnetization vector being close to either the parallel or anti-parallel positions (i.e., nearly perpendicular to the plane of the free layer).

As seen in FIG. 9, the alternating perturbation current is applied after 1 nanosecond and is stopped after 4 nanoseconds. During this time, the alternating perturbation current oscillates between a first voltage value of 0.8 volts and a second voltage value of 1.2 volts, at a the AC perturbation frequency, as indicated by the Voltage line. After of the free layer to the alternating perturbation current, the precession of the free layer becomes phase-locked to the AC perturbation. In addition, before the alternating perturbation current is applied, there is a relatively small precession of the free layer of Device 1, indicated by $m_x$ values of roughly −0.1 to 0.1 (Device 1 line from 0.0 ns to 1.0 ns). Upon application of the alternating perturbation current, the magnitude of the $m_x$ values increases dramatically, achieving oscillation between −1.0 and 1.0, indicating that the magnetization vector of the free layer in essentially completely in plane (Device 1 line, from 1.0 ns to roughly 3.3 ns). The subsequent drop in the amplitude of the oscillations of the $m_x$ value for Device 1 (after 3.3 ns) indicates that the magnetization vector has switched magnetic directions and is precessing towards the direction opposite magnetic direction (i.e., 180 degrees from the initial direction). Similar results are observed for Device 2 (see FIG. 9, Device 2 line).

The synchronization of the alternating perturbation current and the precession frequency of Device 1 is demonstrated by the dashed lines (corresponding to the peak $m_x$ value during the first phase of the precession of the magnetization vector of the free layer) and the dotted lines (corresponding to the peak $m_x$ value during the second phase of the precession of the magnetization vector of the free layer, when the vector is opposite direction). The dashed lines align with the peak voltage values of the alternating perturbation current, indicating alignment of the peak voltage during the first phase of the alternating perturbation current with the peak $m_x$ value of the magnetization vector during the first phase of that vector's precession. Similarly, the dotted lines align with the trough voltage values of the alternating perturbation current, indicating alignment of the trough voltage during the second phase of the alternating perturbation current with the peak $m_x$ value of the magnetization vector during the second phase of that vector's precession. As seen in FIG. 9, the precession of the magnetization vector of the free layer slows as vector approaches equatorial (i.e., fully in-plane) precession, causing the precession frequency to decrease. Thus, the frequency of the alternating perturbation current is synchronized with the maximum precession frequency of the free layer (i.e., the frequency of the precession when the magnetization vector is nearly perpendicular to the plane).

Figure 10:
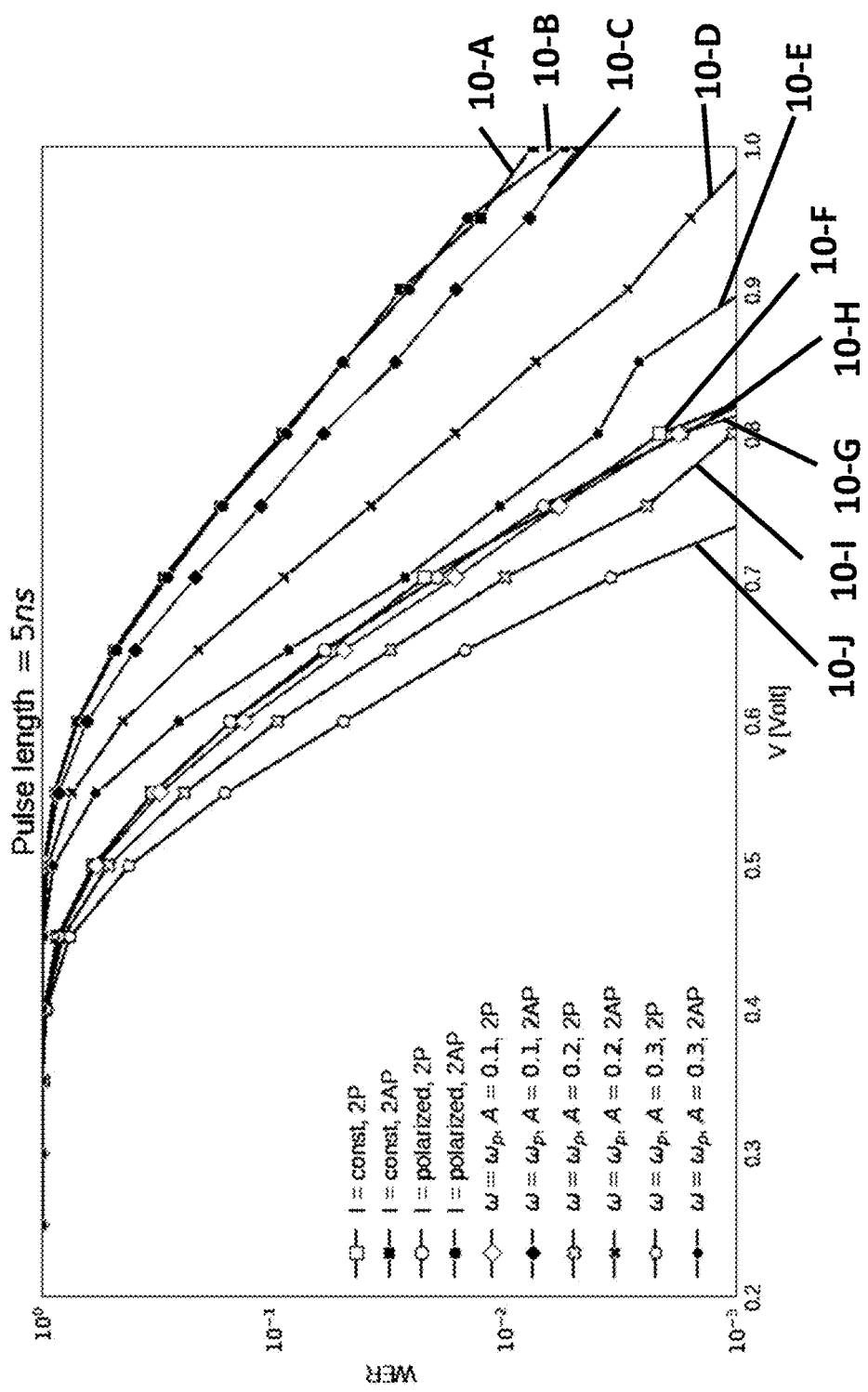
FIG. 10 is a graph of several simulations illustrating the improvement in performance of MTJ devices upon application of a programming current pulse comprising an alternating perturbation current that is synchronized with the precession frequency of the free layer.
Figure 11:
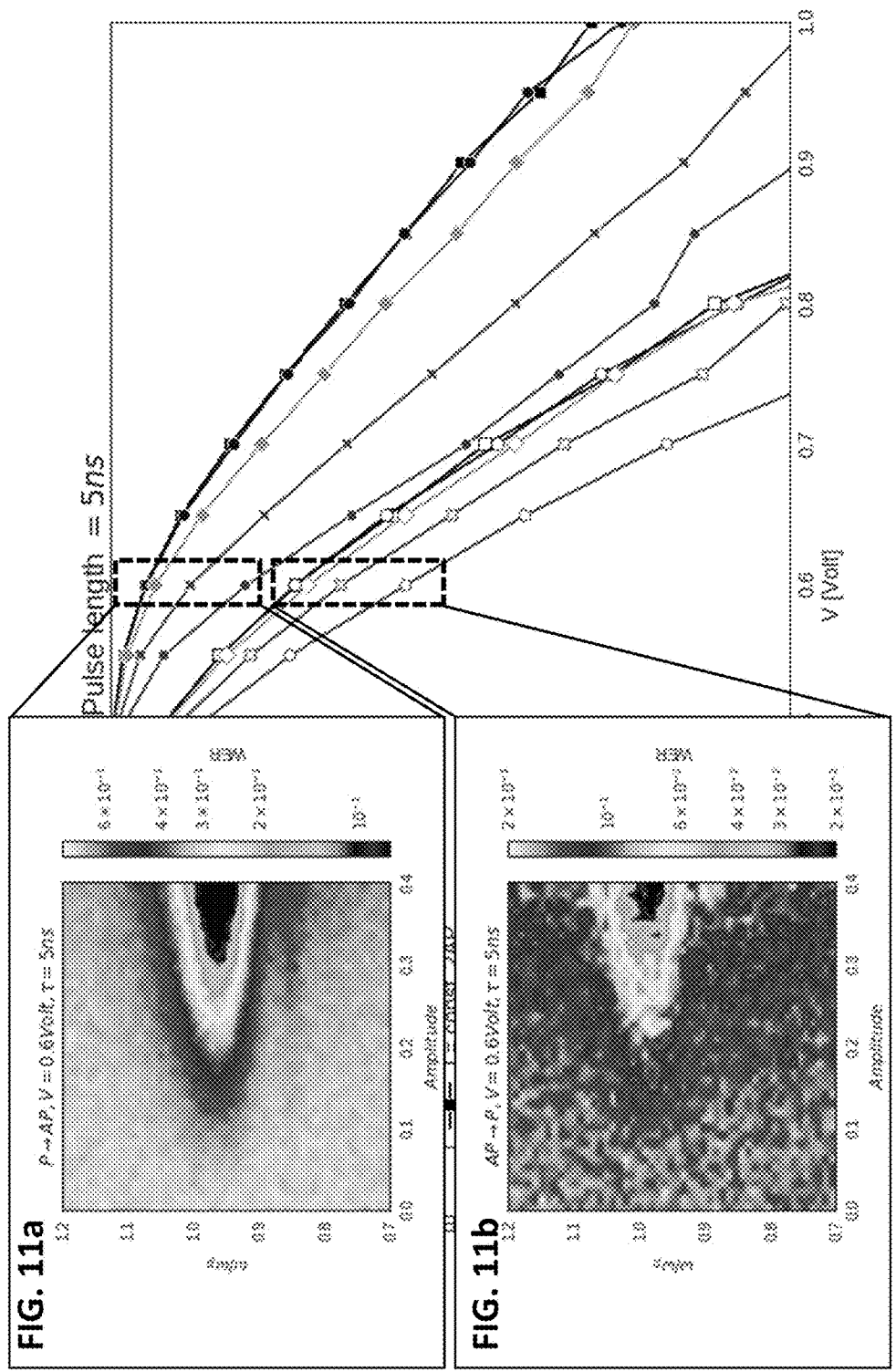
FIGS. 11a-11b are graphs of a subset of the simulation parameters from FIG. 10, illustrating the width of the resonance and the improvement in performance of MTJ devices upon application of programming current pulse comprising an alternating perturbation current that are synchronized with the precession frequency of the free layer.

The results of several simulations of a device having the structure described herein are seen in FIG. 10. The X axis of the graph is the voltage of the direct current component of the programming current that applied to the device. The Y axis is the write error rate (WER), which is indicative of the how easily the magnetization vector of the free layer switches from the first magnetization direction to the second magnetization direction or from the second magnetization direction to the first magnetization direction; the lower the WER, the more effective the applied current is at switching the free layer. The graph depicts two series of transitions: (1) switching the free layer from the parallel direction to the antiparallel direction (filled data points, indicated by "2AP" on the legend); and (2) switching the free layer from the antiparallel direction to the parallel direction (unfilled data points, indicated by "2P" on the legends.) Within each series, different sets of experiments were run, with the perturbation amplitude of the alternating current frequency set to 0%, 10%, 20%, and 30% of the direct current voltage (depicted on the legend as "polarized"; "A=0.1"; "A=0.2"; and "A=0.3", respectively). In each of the simulations, the alternating perturbation frequency ($\omega$) is synchronized with the predetermined precession frequency of the free layer ($\omega_{P_1}$) and the alternating perturbation current is applied to the free layer for a pulse length of 5 ns.

For the first series of simulations (switching from the parallel to anti-parallel directions), both the constant non-polarized current (line 10-A with filled squares) and the constant polarized current (line 10-B with filled circles) had a similar effect on the switching of the free layer. The data show that application of an alternating perturbation current causes a reduction in switching Voltage values for the system, with the switching Voltage values decreasing as the perturbation amplitude increases. This effect can be seen by comparing the lines for the currents with 0% perturbation amplitude (line 10-B with filled circles); 10% perturbation amplitude (line 10-C with filled diamonds), 20% perturbation amplitude (line 10-D with filled crosses); and 30% perturbation amplitude (line 10-E with filled pentagons). The lines that correspond to higher values of the perturbation amplitude lie below the lines with lower values of the perturbation amplitude, suggesting that increasing the perturbation amplitudes reduces the WER, i.e., it reduces the probability that a bit is written incorrectly.

Similar results were obtained in the second series of experiments (switching from the anti-parallel to the parallel direction). No significant change in switching voltage was observed between the constant non-polarized current (line 10-F with empty squares) and the constant polarized current (line 10-G with empty circles). However, the switching Voltage values decrease as the perturbation amplitude increases, as can be observed by comparing the lines with 0% perturbation amplitude (line 10-G with empty circles); 10% perturbation amplitude (line 10-H with empty diamonds), 20% perturbation amplitude (line 10-I with empty crosses); and 30% perturbation amplitude (line 10-J with empty pentagons), respectively. The lines that correspond to higher perturbation amplitude lie below the lines with smaller perturbation amplitude.

Thus, the results in FIG. 10 demonstrate improved switching with the use of a programming current that comprises an alternating perturbation current with an oscillation frequency that is synchronized with the predetermined precession frequency of the free layer thereby demonstrating the significant improvement provided by the various embodiments described herein. In general, the voltage required to switch the magnetization vector from the anti-parallel direction to the parallel direction was considerably less than that required to switch the magnetization vector from the parallel direction to the anti-parallel direction. Moreover, while the use of an alternating perturbation current effectively reduces the switching Voltage value for switching in both directions, this effect is more pronounced for switching from the parallel to the antiparallel direction because the spin-polarization efficiency from the in-plane polarizing layer to the free layer is higher in this case.

FIGS. 11a-11b demonstrate the effect of the frequency and amplitude of the alternating perturbation current on the WER value of selected simulations described in FIG. 10. The Y axis is the ratio between the frequency of the alternating perturbation current ($\omega$) and the predetermined precession frequency of the free layer ($\omega_p$). The X axis is the perturbation amplitude, which ranges from 0% to 40% of the direct current voltage. For these simulations, the voltage of the alternating perturbation current was fixed at 0.6 volts and the system was pulsed for 5 ns. The different shades represent the WER values at each of the corresponding amplitude and frequency ratios. Lower WER values indicate an increased efficiency in the switching of the free layer.

FIG. 11a depicts the results from a set of simulations in which the magnetization vector of the free layer is switched from the parallel direction to the antiparallel direction. The results demonstrate that a reduction in WER occurs when the frequency of alternating perturbation current is roughly equal to the predetermined precession frequency of the free layer (with a ratio value of roughly 0.95 to 1.05) and the perturbation amplitude is at least roughly 15% of the direct current voltage. At higher perturbation amplitudes (30-40% of the direct voltage current), the impact on the WER values is significantly enhanced, indicating a greater assistance with the switching of the free layer. Moreover, the width of the resonance is greater at higher perturbation amplitudes, with appreciable reduction in WER occurring when the frequency ratio is between 0.9 and 1.1.

FIG. 11b demonstrates similar results during the switching of the magnetization vector of the free layer from the antiparallel direction to the parallel direction. Although FIG. 11b has lower resolution than FIG. 11a (due to fewer simulations), similar results are clearly discernable: substantial WER reduction when the $\omega/\omega_p$ ratio is between 0.95 to 1.05; pronounced reduction in WER at higher perturbation amplitudes (particularly 0.3-0.4); and an increase in width of the resonance as the perturbation amplitude increases. Thus, the results of these simulations demonstrate the significant improvement provided by the various embodiments described herein.

Figure 12:
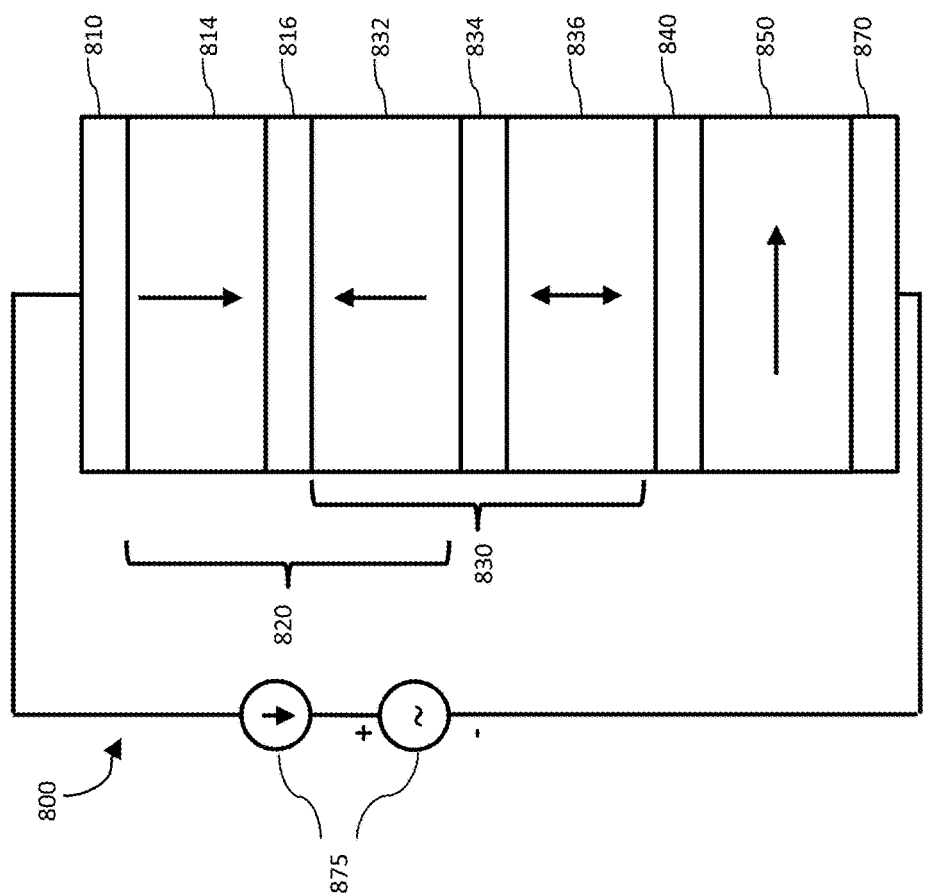
FIG. 12 illustrates an alternative embodiment of an MTJ stack for an MRAM device having a polarizing magnetic layer having a fixed magnetization direction that utilizes a programming current pulse comprising an alternating perturbation current.

An alternative embodiment is shown in FIG. 12. In this embodiment, magnetic device 800 has had its MTJ stack inverted with respect to the embodiment shown in FIG. 8. In particular, magnetic device 800 includes a seed layer 870. In-plane polarization magnetic layer 850 is placed over seed layer 870. Nonmagnetic spacer 840 is placed over in-plane polarization magnetic layer 850. Nonmagnetic spacer 840 has the same properties, construction and characteristics as nonmagnetic spacer 540, discussed above. In-plane polarization magnetic layer 850 has the same properties, construction and characteristics as In-plane polarization magnetic layer 550, discussed above. MTJ 830 is placed over nonmagnetic spacer 840. MTJ 830 is generally constructed of free layer 836 (which is placed over nonmagnetic spacer 850) and reference layer 832. Free layer 836 and reference layer 832 are spatially separated from each other by tunneling barrier layer 834, which is made of an insulating material. Tunneling barrier layer 834 also forms part of synthetic antiferromagnetic (SAF) layer 820. SAF layer 820 is comprised of a first SAF layer 832, which is also the reference layer of device 800, anti-ferromagnetic coupling layer 816 and second SAF layer 814. Anti-ferromagnetic coupling layer 816 is placed over first SAF layer 832. Finally, capping layer 810 is placed over SAF layer 820. The programming current can be provided by a current source 875. Current source 875 can generate a programming current that comprises an alternating perturbation current and a direct current. Other than the ordering of the layers, magnetic device 800 operates in the same manner as described with respect to the embodiment shown in FIG. 7a. Thus, just as shown in FIG. 7a, the in-plane spin transfer torque 610 provides a net benefit of enhancing the efficiency of the switching throughout the entire precession cycle of free layer 836.

All of the layers of devices 500 and 800 illustrated in FIGS. 8 and 12 can be formed by a thin film sputter deposition system as would be appreciated by one skilled in the art. The thin film sputter deposition system can include the necessary physical vapor deposition (PVD) chambers, each having one or more targets, an oxidation chamber and a sputter etching chamber. Typically, the sputter deposition process involves a sputter gas (e.g., oxygen, argon, or the like) with an ultra-high vacuum and the targets can be made of the metal or metal alloys to be deposited on the substrate. Thus, when the present specification states that a layer is placed over another layer, such layer could have been deposited using such a system. Other methods can be used as well. It should be appreciated that the remaining steps necessary to manufacture MTJ stack 500 are well-known to those skilled in the art and will not be described in detail herein so as not to unnecessarily obscure aspects of the disclosure herein.

It should be appreciated to one skilled in the art that a plurality of MTJ structures 500 can be manufactured and provided as respective bit cells of an STT-MRAM device. In other words, each MTJ stack 500 can be implemented as a bit cell for a memory array having a plurality of bit cells.

The above description and drawings are only to be considered illustrative of specific embodiments, which achieve the features and advantages described herein. Modifications and substitutions to specific process conditions can be made. Accordingly, the embodiments in this patent document are not considered as being limited by the foregoing description and drawings.

What is claimed is:

1. A method for inducing a change in a magnetization vector in a magnetic device, wherein the magnetic device comprises a reference magnetic layer in a first plane, the reference magnetic layer having a magnetization vector that is perpendicular to the first plane and having a fixed magnetization direction; a non-magnetic tunnel barrier layer in a second plane and disposed over the reference magnetic layer; a free magnetic layer in a third plane and disposed over the non-magnetic tunnel barrier layer, the free magnetic layer having a magnetization vector that is perpendicular to the third plane and having a magnetization direction that can switch from a first magnetization direction to a second magnetization direction and from the second magnetization direction to the first magnetization direction, with a switching process that involves precessions of the magnetization vector at a precession radius around an axis perpendicular to the third plane, the magnetization vector of the free magnetic layer having a predetermined precession frequency; a non-magnetic spacer in a fourth plane and disposed over the free magnetic layer; and an in-plane polarization magnetic layer in a fifth plane and disposed over the non-magnetic spacer, the in-plane polarization magnetic layer having a magnetization vector that is parallel to the fifth plane;

the method comprising:
(1) generating a programming current pulse, the programming current pulse comprising a constant DC pulse and an alternating perturbation pulse, the constant DC pulse having a constant DC pulse current value, and the alternating perturbation pulse alternating between a maximum current value and a minimum current value at a first frequency;
(2) applying the programming current pulse to the magnetic device, thereby producing a spin-polarized current having spin-polarized electrons, the spin-polarized current alternating between a maximum spin-current value and a minimum spin-current value at the first frequency; and
(3) injecting the spin-polarized current having spin-polarized electrons into the free magnetic layer, thereby exerting a spin transfer torque on the magnetization vector of the free magnetic layer, the spin transfer torque having a perpendicular spin torque component and an in-plane spin torque component, the in-plane spin torque component assisting the perpendicular spin torque component in switching the magnetization direction of the magnetization vector of the free magnetic layer;

wherein the in-plane spin torque component of the spin transfer torque alternates between a maximum magnitude and a minimum magnitude at the first frequency;

wherein the first frequency is synchronized with the predetermined precession frequency of the free magnetic layer, thereby causing the in-plane spin torque component of the spin transfer torque to be at the maximum magnitude when the in-plane spin torque component of the spin transfer torque increases the precession radius of the magnetization vector of the free magnetic layer, and at the minimum magnitude when the in-plane spin torque component of the spin transfer torque decreases the precession radius of the magnetization vector of the free magnetic layer, thereby improving the switching process of the free magnetic layer from the first magnetization direction to the second magnetization direction and from the second magnetization direction to the first magnetization direction.

2. The method of claim 1, wherein a difference in frequency between the first frequency and the predetermined precession frequency of the free magnetic layer is less than twenty percent of the predetermined precession frequency of the free magnetic layer.

3. The method of claim 1, wherein a difference in frequency between the first frequency and the predetermined precession frequency of the free magnetic layer is less than ten percent of the predetermined precession frequency of the free magnetic layer.

4. The method of claim 1, wherein a difference in frequency between the first frequency and the predetermined precession frequency of the free magnetic layer is less than five percent of the predetermined precession frequency of the free magnetic layer.

5. The method of claim 1, wherein a difference in frequency between the first frequency and the predetermined precession frequency of the free magnetic layer is less than two percent of the predetermined precession frequency of the free magnetic layer.

6. The method of claim 1, wherein the constant DC current value is different than zero.

7. The method of claim 1, wherein a difference between the maximum current value and the minimum current value is less than or equal to 100% of the constant DC pulse current value.

8. The method of claim 1, wherein a difference between the maximum current value and the minimum current value is less than or equal to 50% of the constant DC pulse current value.

9. The method of claim 1, wherein a difference between the maximum current value and the minimum current value is less than or equal to 25% of the constant DC pulse current value.

10. The method of claim 1, wherein a difference between the maximum current value and the minimum current value is less than or equal to 10% of the constant DC pulse current value.

11. The method of claim 1, wherein a difference between the maximum current value and the minimum current value is less than or equal to 5% of the constant DC pulse current value.

12. A method for inducing a change in a magnetization vector in a magnetic device, wherein the magnetic device comprises a magnetic tunnel junction in a first plane, the magnetic tunnel junction comprising a reference magnetic layer, a non-magnetic tunnel barrier layer, and a free magnetic layer, the free magnetic layer and the reference magnetic layer separated by the non-magnetic tunnel barrier layer, the reference magnetic layer having a magnetization vector that is perpendicular to the first plane and having a fixed magnetization direction, the free magnetic layer having a magnetization vector that is perpendicular to the first plane and having a magnetization direction that can switch from a first magnetization direction to a second magnetization direction and from the second magnetization direction to the first magnetization direction, with a switching process that involves precessions around an axis perpendicular to the first plane, the magnetization vector of the free magnetic layer having a predetermined precession frequency; a non-magnetic spacer in a second plane, the non-magnetic spacer separating the magnetic tunnel junction from an in-plane polarization magnetic layer in a third plane, the in-plane polarization magnetic layer having a magnetization vector that is parallel to the third plane;

the method comprising:
(1) generating a programming current pulse, the programming current pulse comprising an alternating perturbation pulse, the alternating perturbation pulse alternating between a maximum current value and a minimum current value at a first frequency;
(2) applying the programming current pulse to the magnetic device, thereby producing a spin-polarized current having spin-polarized electrons, the spin-polarized current alternating between a maximum spin-current value and a minimum spin-current value at the first frequency;
(3) injecting the spin-polarized current having spin-polarized electrons into the free magnetic layer, thereby exerting a spin transfer torque on the magnetization vector of the free magnetic layer; and
(4) switching the magnetization vector of the free magnetic layer from the first magnetization direction to the second magnetization direction or from the second magnetization direction to the first magnetization direction;

wherein the first frequency is synchronized with the predetermined precession frequency of the free magnetic layer, thereby modifying the magnitude of the spin transfer torque exerted on the magnetization vector of the free layer to enhance the efficiency of the switching process.

13. The method of claim 12, wherein the programming current pulse further comprises a direct current pulse having a direct current value.

14. The method of claim 13, wherein the direct current value is fixed throughout the switching process.

15. The method of claim 14, wherein the difference between the maximum current value and the minimum current value is less than or equal to 100% of the constant DC pulse current value.

16. The method of claim 14, wherein the difference between the maximum current value and the minimum current value is less than or equal to 50% of the constant DC pulse current value.

17. The method of claim 14, wherein the difference between the maximum current value and the minimum current value is less than or equal to 25% of the constant DC pulse current value.

18. The method of claim 14, wherein the difference between the maximum current value and the minimum current value is less than or equal to 10% of the constant DC pulse current value.

19. The method of claim 14, wherein the difference between the maximum current value and the minimum current value is less than or equal to 5% of the constant DC pulse current value.

20. The method of claim 12, wherein a difference in frequency between the first frequency and the predetermined precession frequency of the free magnetic layer is less than twenty percent of the predetermined precession frequency of the free magnetic layer.

21. The method of claim 12, wherein a difference in frequency between the first frequency and the predetermined precession frequency of the free magnetic layer is less than ten percent of the predetermined precession frequency of the free magnetic layer.

22. The method of claim 12, wherein a difference in frequency between the first frequency and the predetermined precession frequency of the free magnetic layer is less than five percent of the predetermined precession frequency of the free magnetic layer.

23. A magnetic device comprising:
a magnetic tunnel junction in a first plane, comprising a reference magnetic layer, a non-magnetic tunnel barrier layer, and a free magnetic layer, the free magnetic layer and the reference magnetic layer separated by the non-magnetic tunnel barrier layer, the reference magnetic layer having a magnetization vector that is perpendicular to the first plane and having a fixed magnetization direction, the free magnetic layer having a magnetization vector that is perpendicular to the first plane and having a magnetization direction that can switch from a first magnetization direction to a second magnetization direction and from the second magnetization direction to the first magnetization direction, with a switching process that involves precessions of the magnetization vector at a precession radius around an axis perpendicular to the first plane;
a non-magnetic spacer in a second plane, separating the magnetic tunnel junction from an in-plane polarization magnetic layer;
the in-plane polarization magnetic layer in a third plane, the polarization magnetic layer having a magnetization vector that is parallel to the third plane; and
a current source that directs a programming current pulse through the magnetic tunnel junction, the non-magnetic spacer, and the in-plane polarization magnetic layer, the programming current pulse comprising a direct current pulse and an alternating perturbation pulse, the alternating perturbation pulse alternating between a maximum current value and a minimum current value at a first frequency;
wherein application of the programming current pulse to the magnetic device produces a spin-polarized current having spin-polarized electrons, the spin-polarized current alternating between a maximum spin-current value and a minimum spin-current value at the first frequency, the spin-polarized electrons exerting a spin transfer torque on the magnetization vector of the free magnetic layer, the spin transfer torque having a perpendicular spin torque component and an in-plane spin torque component, the in-plane spin torque component of the spin transfer torque alternating between a maximum magnitude and a minimum magnitude at the first frequency;
wherein the first frequency is synchronized with the predetermined precession frequency of the free magnetic layer, thereby causing the in-plane spin torque component of the spin transfer torque to be at the maximum magnitude when the in-plane spin torque component of the spin transfer torque increases the precession radius of the magnetization vector of the free magnetic layer, and at the minimum magnitude when the in-plane spin torque component of the spin transfer torque decreases the precession radius of the magnetization vector of the free magnetic layer, thereby improving the switching process of the free magnetic layer from the first magnetization direction to the second magnetization direction and from the second magnetization direction to the first magnetization direction.

24. The magnetic device of claim 23, wherein the direct current pulse has a current value different than zero.

25. The magnetic device of claim 23, wherein the direct current pulse has a value that is fixed throughout the duration of the pulse.

26. The magnetic device of claim 23, wherein the magnetization vector of the polarization magnetic layer is fixed.

27. The magnetic device of claim 23, wherein the free magnetic layer comprises CoFeB.

28. The magnetic device of claim 23, wherein the non-magnetic tunnel barrier layer comprises MgO.

29. The magnetic device of claim 23, wherein the in-plane polarization magnetic layer comprises Fe, FeV, FeB, or CoFeB.

30. The magnetic device of claim 23, wherein the in-polarization magnetic layer comprises CoFeB.

31. The magnetic device of claim 23, wherein the non-magnetic spacer comprises MgO.

* * * * *